US010957405B2

(12) United States Patent
Yamada et al.

(10) Patent No.: US 10,957,405 B2
(45) Date of Patent: Mar. 23, 2021

(54) MEMORY SYSTEM CONFIGURED TO UPDATE WRITE VOLTAGE APPLIED TO MEMORY CELLS BASED ON NUMBER OF WRITE OR ERASE OPERATIONS

(71) Applicant: TOSHIBA MEMORY CORPORATION, Tokyo (JP)

(72) Inventors: Hideki Yamada, Yokohama Kanagawa (JP); Masanobu Shirakawa, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/548,136

(22) Filed: Aug. 22, 2019

(65) Prior Publication Data

US 2020/0234776 A1 Jul. 23, 2020

(30) Foreign Application Priority Data

Jan. 21, 2019 (JP) .............................. JP2019-008005

(51) Int. Cl.
*G11C 16/34* (2006.01)
*G11C 16/10* (2006.01)
*G11C 11/56* (2006.01)
*G11C 16/32* (2006.01)

(52) U.S. Cl.
CPC ...... *G11C 16/3404* (2013.01); *G11C 11/5628* (2013.01); *G11C 11/5671* (2013.01); *G11C 16/10* (2013.01); *G11C 16/32* (2013.01); *G11C 16/349* (2013.01); *G11C 16/3459* (2013.01); *G11C 2211/5621* (2013.01)

(58) Field of Classification Search
CPC ..................................................... G11C 16/349
USPC ..................................................... 365/185.18
See application file for complete search history.

(56) References Cited

U.S. PATENT DOCUMENTS

| 7,339,834 | B2 | 3/2008 | Lutze |  |
|---|---|---|---|---|
| 7,453,731 | B2 | 11/2008 | Tu et al. |  |
| 7,551,482 | B2 | 6/2009 | Kamei et al. |  |
| 2012/0287710 | A1* | 11/2012 | Shirakawa | G11C 16/3418 365/185.03 |
| 2015/0340099 | A1* | 11/2015 | Kwak | G11C 11/5628 711/103 |

(Continued)

FOREIGN PATENT DOCUMENTS

| JP | 4819951 B2 | 11/2011 |
| JP | 4931915 B2 | 5/2012 |
| JP | 2016-62619 A | 4/2016 |

*Primary Examiner* — Hoai V Ho
(74) *Attorney, Agent, or Firm* — Kim & Stewart LLP

(57) ABSTRACT

A memory system includes a semiconductor storage device including a memory cell array including a plurality of groups of memory cells, and a control circuit configured to perform, upon receipt of a write command, a write operation on one of the groups of memory cells, and a memory controller is configured to, when transmitting the write command to perform the write operation on the one of the groups of memory cells, determine a first write voltage value for the write operation based on a total number of write operations or erase operations that have been performed on the one of the groups of memory cells, and transmit the write command to the semiconductor storage device together with the determined first write voltage value.

20 Claims, 20 Drawing Sheets

(56) References Cited

U.S. PATENT DOCUMENTS

2016/0078948 A1     3/2016   Shirakawa
2018/0261275 A1*   9/2018   Takizawa ............... G11C 16/10

* cited by examiner

FIG. 5

| CHIP | BLOCK | WORD LINE | STRING UNIT | IVPGM | NUMBER OF W/E |
|---|---|---|---|---|---|
| Chip0 | BLK0 | WL0 | SU0 | "00" (no data) | ⋮ |
| | | | SU1 | "00" (no data) | ⋮ |
| | | | SU2 | VPGM0 +kΔVPGM | ⋮ |
| | | | SU3 | VPGM0 +(k+1)ΔVPGM | ⋮ |
| | | WL1 | SU0 | ⋮ | ⋮ |
| | | | ⋮ | ⋮ | ⋮ |
| | | | SU3 | ⋮ | ⋮ |
| | | ⋮ | ⋮ | ⋮ | ⋮ |
| | | WL7 | SU3 | ⋮ | ⋮ |
| | BLK1 | WL0 | SU0 | ⋮ | ⋮ |
| | | ⋮ | ⋮ | ⋮ | ⋮ |
| | | WL7 | SU3 | ⋮ | ⋮ |
| | ⋮ | ⋮ | ⋮ | ⋮ | ⋮ |
| Chip1 | BLK0 | WL0 | SU0 | ⋮ | ⋮ |
| | ⋮ | ⋮ | ⋮ | ⋮ | ⋮ |

FIG. 16

| CHIP | BLOCK | WORD LINE | STRING UNIT | IVPGM | NUMBER OF W/E |
|---|---|---|---|---|---|
| Chip0 | BLK0 | WL0 | SU0 | VPGM0 +kΔVPGM | ⋮ |
| | | | SU1 | | ⋮ |
| | | | SU2 | | ⋮ |
| | | | SU3 | | ⋮ |
| | | WL1 | SU0 | VPGM0 +(k+2)ΔVPGM | ⋮ |
| | | | ⋮ | | ⋮ |
| | | | SU3 | | ⋮ |
| | | ⋮ | ⋮ | ⋮ | ⋮ |
| | | WL7 | SU3 | ⋮ | ⋮ |
| | BLK1 | WL0 | SU0 | ⋮ | ⋮ |
| | | ⋮ | ⋮ | ⋮ | ⋮ |
| | | WL7 | SU3 | ⋮ | ⋮ |
| | ⋮ | ⋮ | ⋮ | ⋮ | ⋮ |
| Chip1 | BLK0 | WL0 | SU0 | ⋮ | ⋮ |
| | ⋮ | ⋮ | ⋮ | ⋮ | ⋮ |

FIG. 17

| CHIP | BLOCK | WORD LINE | STRING UNIT | FIRST SET | | SECOND SET | |
|---|---|---|---|---|---|---|---|
| | | | | IVPGM | NUMBER OF W/E | IVPGM | NUMBER OF W/E |
| Chip0 | BLK0 | WL0 | SU0 | VPGM0 +k ΔVPGM | ... | VPGM0 +(k+3) ΔVPGM | ... |
| | | | SU1 | | ... | | ... |
| | | | SU2 | | ... | | ... |
| | | | SU3 | | ... | | ... |
| | | WL1 | SU0 | VPGM0 +(k+2) ΔVPGM | ... | VPGM0 +(k+4) ΔVPGM | ... |
| | | | ... | | ... | | ... |
| | | | SU3 | | ... | | ... |
| | | ... | ... | ... | ... | ... | ... |
| | | WL7 | SU0 | ... | ... | ... | ... |
| | BLK1 | WL0 | SU3 | ... | ... | ... | ... |
| | | ... | SU0 | ... | ... | ... | ... |
| | | WL7 | ... | ... | ... | ... | ... |
| | | | SU3 | ... | ... | ... | ... |
| | ... | ... | ... | ... | ... | ... | ... |
| Chip1 | BLK0 | WL0 | SU0 | ... | ... | ... | ... |
| | ... | ... | ... | ... | ... | ... | ... |

FIG. 18

| WORD LINE | STRING UNIT | IVPGM |
|---|---|---|
| WL0 | SU0 | VPGM0 +13ΔVPGM |
| WL0 | SU1 | VPGM0 +12ΔVPGM |
| WL0 | SU2 | VPGM0 +12ΔVPGM |
| WL0 | SU3 | VPGM0 +12ΔVPGM |
| WL1 | SU0 | VPGM0 +14ΔVPGM |
| WL1 | SU1 | VPGM0 +12ΔVPGM |
| ... | ... | ... |
| WL7 | SU3 | VPGM0 +13ΔVPGM |

⇧ UPDATE PROCESS FOR WL1/SU0

| | IVPGM |
|---|---|
| | |
| | |
| | |
| | |
| | VPGM0 +12ΔVPGM |
| | |
| | |
| | |

⇧ REFLECT DIFFERENCE (−Δ2VPGM) OF WL1/SU0 IN ANOTHER GROUP

| IVPGM |
|---|
| VPGM0 +11ΔVPGM |
| VPGM0 +10ΔVPGM |
| VPGM0 +10ΔVPGM |
| VPGM0 +10ΔVPGM |
| VPGM0 +12ΔVPGM |
| VPGM0 +10ΔVPGM |
| ... |
| VPGM0 +11ΔVPGM |

FIG. 20

IVPGM CORRECTION AMOUNT

|  | | TEMPERATURE | |
| --- | --- | --- | --- |
|  | | LOW TEMPERATURE STATE | HIGH TEMPERATURE STATE |
| NUMBER OF W/E | $N_0(=0) \sim N_1$ | | |
| | $N_1 \sim N_2$ | | |
| | $\vdots$ | | |
| | $N_{(max-1)} \sim N_{max}$ | | |

MEMORY SYSTEM CONFIGURED TO UPDATE WRITE VOLTAGE APPLIED TO MEMORY CELLS BASED ON NUMBER OF WRITE OR ERASE OPERATIONS

CROSS-REFERENCE TO RELATED APPLICATION

This application is based upon and claims the benefit of priority from Japanese Patent Application No. 2019-008005, filed Jan. 21, 2019, the entire contents of which are incorporated herein by reference.

FIELD

Embodiments described herein relate generally to a memory system.

BACKGROUND

A memory system is known which includes a memory controller that controls a NAND flash memory as a non-volatile memory.

DESCRIPTION OF THE DRAWINGS

FIG. 5 is a conceptual diagram illustrating an initial write voltage management table stored in a memory controller according to the first embodiment.

FIG. 16 is a conceptual diagram illustrating an initial write voltage management table stored in a memory controller according to a first modification example.

FIG. 17 is a conceptual diagram illustrating an initial write voltage management table stored in a memory controller according to a modification example of the first modification example.

FIG. 18 is a conceptual diagram illustrating an update process of an initial write voltage management table in a memory system according to a second modification example.

FIG. 20 is a conceptual diagram illustrating an initial write voltage correction table stored in a memory controller according to the third modification example.

DETAILED DESCRIPTION

Figure 1:
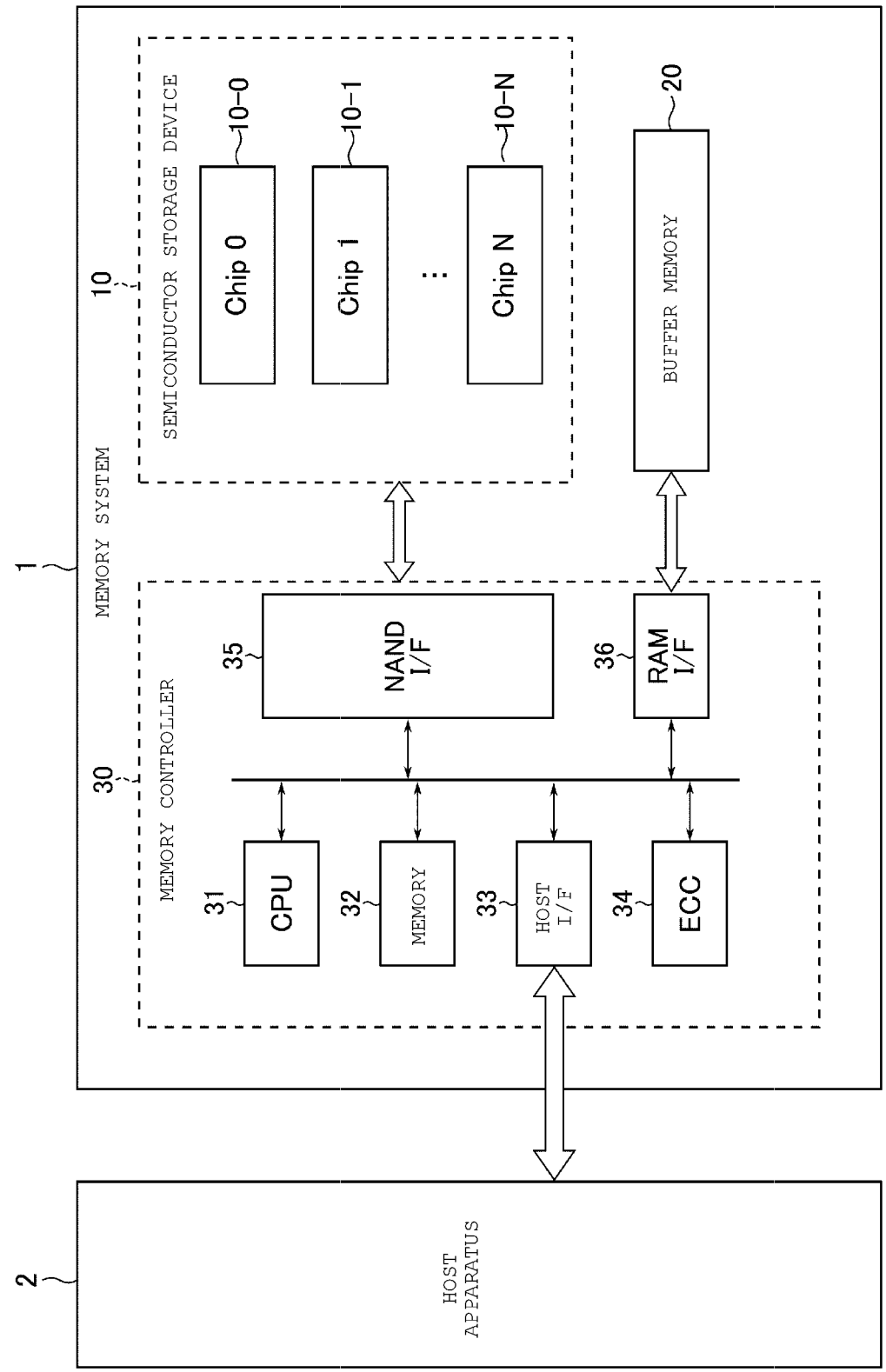
FIG. 1 is a block diagram illustrating a configuration of a memory system according to a first embodiment.

Embodiments provide a memory system which reduces time for writing data into a non-volatile memory.

In general, according to one embodiment, a memory system includes a semiconductor storage device including a memory cell array including a plurality of groups of memory cells, and a control circuit configured to perform, upon receipt of a write command, a write operation on one of the groups of memory cells, and a memory controller is configured to, when transmitting the write command to perform the write operation on the one of the groups of memory cells, determine a first write voltage value for the write operation based on a total number of write operations or erase operations that have been performed on the one of the groups of memory cells, and transmit the write command to the semiconductor storage device together with the determined first write voltage value.

Hereinafter, embodiments will be described with reference to the drawings. In the following description, configuration elements having the same function and configuration are denoted by the same reference numerals or symbols. When a plurality of configuration elements having a common reference numeral or symbol are distinguished, the common reference numeral or symbol is distinguished by adding subscripts thereto. When the plurality of configuration elements do not need to be distinguished in particular, only the common reference numeral or symbol is attached to the plurality of configuration elements, and the subscripts are not attached.

1. First Embodiment

A memory system according to a first embodiment is, for example, a solid state drive (SSD), and may store data in a non-volatile manner. The memory system according to the first embodiment will be described below.

1.1 Configuration

A configuration of the memory system according to the first embodiment will be described.

1.1.1 Configuration of Memory System

FIG. 1 illustrates a configuration example of the memory system according to the first embodiment.

As illustrated in FIG. 1, a memory system 1 is connected to an external host apparatus 2 and can perform various operations in response to an instruction from the host apparatus 2. The memory system 1 includes, for example, a semiconductor storage device 10 or a plurality of semiconductor storage devices 10-0, 10-1, . . . , and 10-N (N is, for example, an integer greater than or equal to 2), a buffer memory 20, and a memory controller 30.

The semiconductor storage devices 10-0, 10-1, . . . , and 10-N are NAND flash memory chips that store data in a nonvolatile manner, and are also referred to as chips Chip0, Chip1, . . . , and ChipN. The memory system 1 may include any number of semiconductor storage devices 10. A detailed configuration of the semiconductor storage device 10 will be described below.

The buffer memory 20 is, for example, a volatile memory such as a dynamic random access memory (DRAM), and is used as a storage region of the memory controller 30. The buffer memory 20 temporarily stores write data received from the host apparatus 2 or read data read from the semiconductor storage device 10. The buffer memory 20 may be embedded in the memory controller 30, the host apparatus 2 or the like.

The memory controller 30 is, for example, a System-on-a-Chip (SoC), and commands the semiconductor storage device 10 to perform a read operation, a write operation, and an erasure operation in response to a command from the host apparatus 2. The memory controller 30 includes, for example, a central processing unit (CPU) 31, a memory 32, a host interface circuit 33, an error correction code (ECC) circuit 34, a NAND interface circuit 35, and a RAM interface circuit 36.

The CPU 31 controls an overall operation of the memory controller 30. The CPU 31 issues a write command in response to a write command received from, for example, the host apparatus 2. The CPU 31 includes a processing circuit (not illustrated) that determines a write voltage to be applied to the semiconductor storage device 10, for example, in the issue of the write command.

The memory 32 is a volatile memory such as a static random access memory (SRAM). The memory 32 is used as a working memory of the CPU 31, and stores, for example, firmware for managing the semiconductor storage device 10, various management tables, and the like. Specifically, for example, the memory 32 may function as a register that stores an initial write voltage management table (not illustrated) used to manage an initial write voltage applied to the semiconductor storage device 10. Details of the initial write voltage and the initial write voltage management table will be described below.

The host interface (I/F) circuit 33 is connected to the host apparatus 2 via a host bus, and controls transfer of data, a command, and an address between the memory controller 30 and the host apparatus 2. The host interface circuit 33 may support communication interface standards such as, a serial advanced technology attachment (SATA), a serial attached SCSI (SAS), and the PCI Express (PCIe) (registered trademark).

The ECC circuit 34 performs an error correction process of data. At the time of a write operation, the ECC circuit 34 generates a parity based on the write data received from the host apparatus 2 and applies the generated parity to the write data. At the time of a read operation, the ECC circuit 34 generates a syndrome based on the read data received from the semiconductor storage device 10 and detects and corrects an error in the read data based on the generated syndrome.

The NAND interface circuit 35 may control transfer of data, a command, and an address between the memory controller 30 and the semiconductor storage device 10 and independently control each chip in the semiconductor storage device 10. The NAND interface circuit 35 supports a NAND interface standard.

The RAM interface circuit 36 is connected to the buffer memory 20 and manages communication between the memory controller 30 and the buffer memory 20. The RAM interface circuit 36 supports, for example, a DRAM interface standard.

1.1.2 Configuration of NAND Flash Memory

Figure 2:
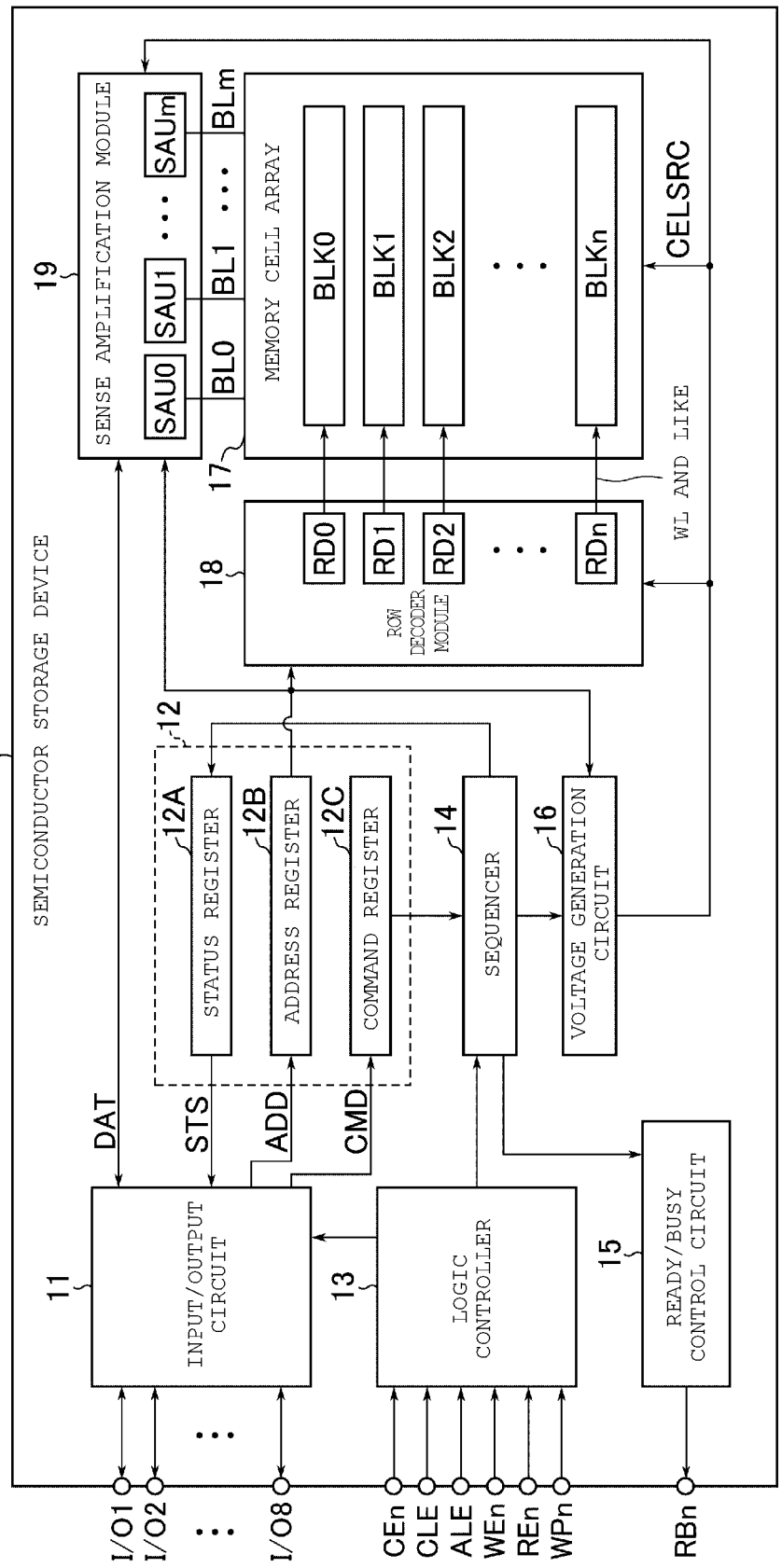
FIG. 2 is a block diagram illustrating a configuration of a semiconductor storage device according to the first embodiment.

FIG. 2 illustrates a configuration example of the semiconductor storage device 10 provided in the memory system according to the first embodiment.

As illustrated in FIG. 2, the semiconductor storage device 10 includes, for example, an input/output circuit 11, a register set 12, a logic controller 13, a sequencer 14, a ready/busy control circuit 15, a voltage generation circuit 16, a memory cell array 17, and a row decoder module 18, and a sense amplification module 19.

The input/output circuit 11 transmits and receives, for example, input/output signals I/O1 to I/O8 having a width of 8 bits to and from the memory controller 30. The input/output signals I/O may include data DAT, status information STS, address information ADD, a command CMD, and the like. The input/output circuit 11 transmits and receives the data DAT to and from the sense amplification module 19.

The register set 12 includes a status register 12A, an address register 12B, and a command register 12C. The status register 12A, the address register 12B, and the command register 12C store the status information STS, the address information ADD, and the command CMD, respectively.

The status information STS is updated based on an operation state of, for example, the sequencer 14. The status information STS is transferred from the status register 12A to the input/output circuit 11 based on an instruction from the memory controller 30 and is output to the memory controller 30. The address information ADD is transferred from the input/output circuit 11 to the address register 12B and includes, for example, a chip address, a block address, a page address, a column address, and the like. The command CMD is transferred from the input/output circuit 11 to the command register 12C and includes commands regarding various operations of the semiconductor storage device 10.

The logic controller 13 controls each of the input/output circuit 11 and the sequencer 14, based on control signals received from the memory controller 30. For example, a chip enable signal CEn, a command latch enable signal CLE, an address latch enable signal ALE, a write enable signal WEn, a read enable signal REn, and a write protection signal WPn are used as the control signals.

The chip enable signal CEn is a signal for enabling the semiconductor storage device 10. The command latch enable signal CLE is a signal for notifying the input/output circuit 11 that the received input/output signal I/O is the command CMD. The address latch enable signal ALE is a signal for notifying the input/output circuit 11 that the received input/output signal I/O is the address information ADD. The write enable signal WEn is a signal for instructing the input/output circuit 11 to input the input/output signal I/O. The read enable signal REn is a signal for instructing the input/output circuit 11 to output the input/output signal I/O. The write protection signal WPn is a signal for making the semiconductor storage device 10 enter a protection state when power is turned on or off.

The sequencer 14 controls an overall operation of the semiconductor storage device 10. For example, the sequencer 14 performs a read operation, a write operation, an erasure operation, and the like, based on the command CMD stored in the command register 12C and the address information ADD stored in the address register 12B.

The ready/busy control circuit 15 generates a ready/busy signal RBn based on the operation state of the sequencer 14. The ready/busy signal RBn is a signal for notifying the memory controller 30 whether the semiconductor storage device 10 is in a ready state or in a busy state. In the present specification, the "ready state" indicates that the semiconductor storage device 10 is in a state of being able to receive a command from the memory controller, and the "busy state" indicates that the semiconductor storage device 10 is in a state of not being able to receive a command from the memory controller.

The voltage generation circuit 16 generates a voltage used in the read operation, the write operation, the erasure operation, and the like. The voltage generation circuit 16 supplies the generated voltage to the memory cell array 17, the row decoder module 18, and the sense amplification module 19.

The memory cell array 17 includes a plurality of blocks BLK0 to BLKn (n is an integer greater than or equal to 1). The block BLK is a set of a plurality of memory cell transistors capable of storing data in a nonvolatile manner and is a unit for erasing data. The memory cell array 17 includes a plurality of bit lines BL0 to BLm (m is an integer greater than or equal to 1), a plurality of word lines WL, a source line CELSRC, and a well line. For example, a voltage generation circuit 16 applies a voltage to the source line CELSRC. Each memory cell transistor is associated with 1-bit line BL and one word line WL. A detailed circuit configuration of the memory cell array 17 will be described below.

The row decoder module 18 selects the block BLK based on the block address to perform various processes. The row decoder module 18 transfers a voltage supplied from the voltage generation circuit 16 to various wires in the selected block BLK. The row decoder module 18 includes, for example, a plurality of row decoders RD0 to RDn. The row decoders RD0 to RDn are associated with the blocks BLK0 to BLKn, respectively.

The sense amplification module 19 reads data from the memory cell array 17 and transfers the read data to the input/output circuit 11 in the read operation. The sense amplification module 19 applies a desirable voltage to the bit line BL based on the data received from the input/output circuit in the write operation. For example, the sense amplification module 19 includes a plurality of sense amplification units SAU0 to SAUm. The sense amplification units SAU0 to SAUm are associated with the bit lines BL0 to BLm, respectively.

The sense amplification unit SAU includes, for example, a sense amplification unit SA and latch circuits SDL, ADL, BDL, and XDL. For example, in the read operation, the sense amplification unit SA determines whether the read data is "0" or "1" based on a voltage of the corresponding bit line BL. In other words, the sense amplification unit SA senses the data read to the corresponding bit line BL and determines the data stored in the selected memory cell. The latch circuits SDL, ADL, BDL, and XDL temporarily store read data, write data, and the like. The latch circuit XDL may be used to transmit and receive the data DAT between the sense amplification unit SAU and the input/output circuit 11.

1.1.3 Circuit Configuration of Memory Cell Array

Figure 3:
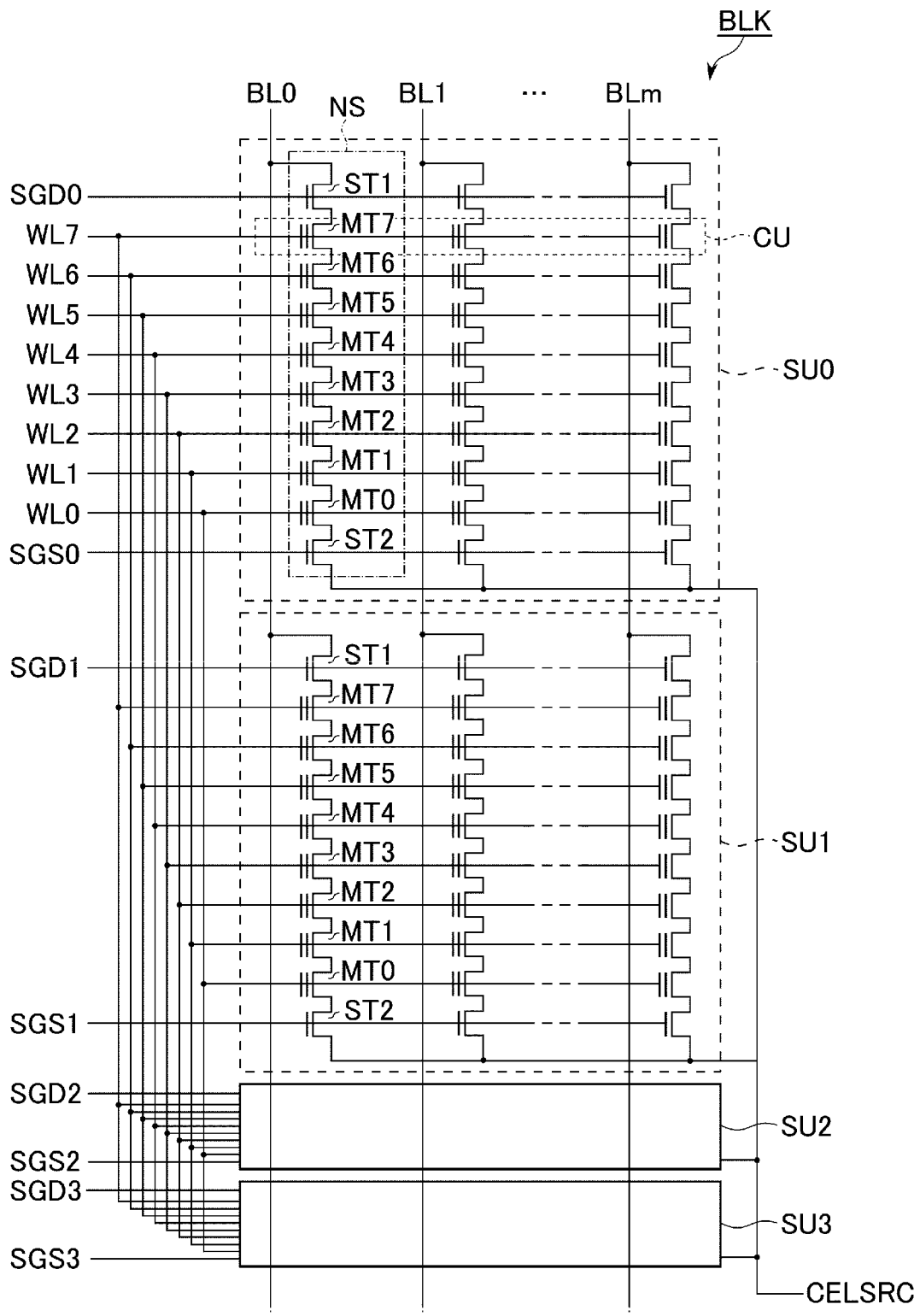
FIG. 3 is a circuit diagram illustrating a configuration of a memory cell array according to the first embodiment.

FIG. 3 is an example of a circuit configuration of the memory cell array 17 in the semiconductor storage device 10 in the memory system according to the first embodiment and illustrates extracted one block BLK. As illustrated in FIG. 3, the block BLK includes, for example, four string units SU0 to SU3.

Each string unit SU includes a plurality of NAND strings NS respectively associated with the bit lines BL0 to BLm. Each NAND string NS includes, for example, memory cell transistors MT0 to MT7, and select transistors ST1 and ST2.

The memory cell transistor MT includes a control gate and a charge storage layer and stores data in a nonvolatile manner. Each of the select transistors ST1 and ST2 is used to select a string unit SU in various processes.

In each NAND string NS, the memory cell transistors MT0 to MT7 are connected in series. The select transistor ST1 is connected between one end of the memory cell transistors MT0 to MT7 connected in series and the associated bit line BL. A drain of the select transistor ST2 is connected to the other end of the memory cell transistors MT0 to MT7 connected in series. The source line CELSRC and the well line (not illustrated) are connected to a source of the select transistor ST2.

In the same block BLK, the gates of the plurality of select transistors ST1 in each of the string units SU0 to SU3 are commonly connected to the select gate lines SGD0 to SGD3. The control gates of the plurality of memory cell transistors MT0 to MT7 are commonly connected to the word lines WL0 to WL7, respectively. The gates of the plurality of select transistors ST2 are commonly connected to the select gate lines SGS0 to SGS3, respectively. The respective gates of the plurality of select transistors ST2 may be commonly connected to one select gate line (not illustrated).

The bit lines BL0 to BLm are shared among the plurality of blocks BLK. The same bit line BL is connected to the NAND strings NS corresponding to the same column address. The respective word lines WL0 to WL7 are provided for each block BLK. Each of the source line CELSRC and the well line (not illustrated) is shared among, for example, the plurality of blocks BLK.

A set of a plurality of memory cell transistors MT connected to the common word line WL in one string unit SU is referred to as, for example, a cell unit CU. For example, a storage capacity of the cell unit CU including the memory cell transistors MT, each storing 1-bit data, is defined as "1-page data". The cell unit CU may have a storage capacity of two or more page data according to the number of bits of data stored in the memory cell transistors MT.

The circuit configuration of the memory cell array 17 described above is merely an example and the embodiments are not limited to this. For example, any number of string units SU may be included in each block BLK. Any number of memory cell transistors MT and select transistors ST1 and ST2 may be included in each NAND string NS.

1.1.4 Storage Method of Data

The memory system 1 can operate in, for example, several write modes. For example, the memory system 1 operates in a single-level cell (SLC) mode, a multi-level cell (MLC) mode, a triple-level cell (TLC) mode, or a quadruple-level cell (QLC) mode. The SLC mode, the MLC mode, the TLC mode, and the QLC mode are write modes in which 1-bit data, 2-bit data, 3-bit data, and 4-bit data are stored in one memory cell transistor MT, respectively.

Figure 4:
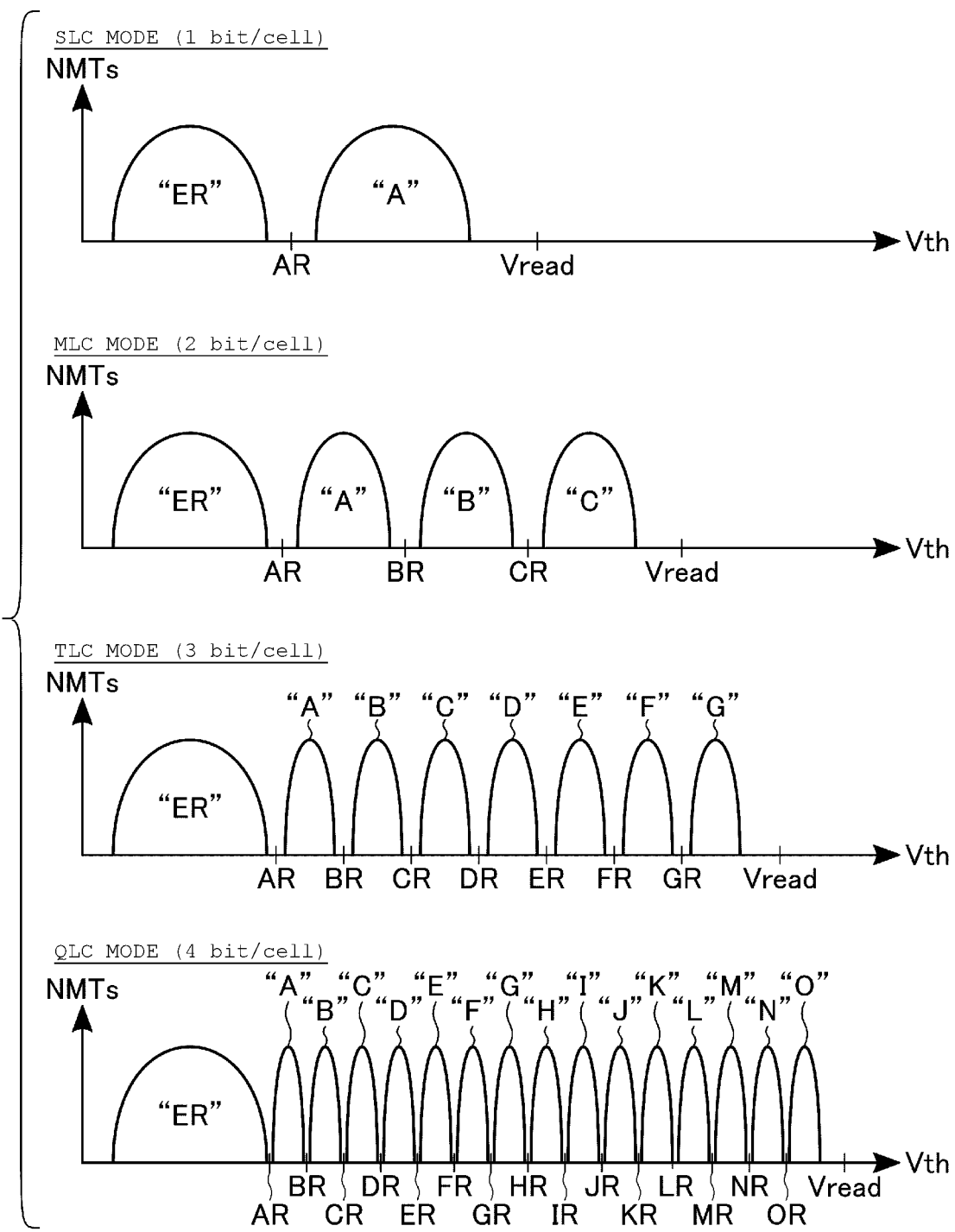
FIG. 4 is a schematic diagram illustrating a threshold voltage distribution of the memory cell array according to the first embodiment.

FIG. 4 is an example of a distribution of threshold voltages of the memory cell transistors MT in the memory system 1 according to the first embodiment. FIG. 4 illustrates threshold voltage distributions and read voltages in the SLC mode, the MLC mode, the TLC mode, and the QLC mode. In the threshold voltage distributions illustrated in FIG. 4, the vertical axes correspond to the number NMTs of memory cell transistors MT, and the horizontal axes correspond to threshold voltages Vth of the memory cell transistors MT. As illustrated in FIG. 4, the plurality of memory cell transistors MT form a plurality of threshold voltage distributions according to the applied write mode, that is, the number of bits of data to be stored.

When the SLC mode (i.e., 1 bit/cell) is used, the threshold voltages of the plurality of memory cell transistors MT form two threshold voltage distributions. The two threshold voltage distributions are referred to as, for example, an "ER" state and an "A" state, respectively, in an ascending order of the threshold voltages. In the SLC mode, 1-bit data different from each other are assigned to the threshold voltage distributions of the "ER" state and the "A" state, respectively.

When the MLC mode (i.e., 2 bit/cell) is used, the threshold voltages of the plurality of memory cell transistors MT form four threshold voltage distributions. The four threshold voltage distributions are referred to as, for example, the "ER" state, the "A" state, a "B" state, and a "C" state in an ascending order of the threshold voltages. In the MLC mode, 2-bit data different from each other are assigned to the threshold voltage distributions of the "ER" state to the "C" state, respectively.

When the TLC mode (i.e., 3 bit/cell) is used, the threshold voltages of the plurality of memory cell transistors MT form eight threshold voltage distributions. The eight threshold voltage distributions are referred to as, for example, the "ER" state, the "A" state, the "B" state, the "C" state, a "D" state, an "E" state, an "F" state, and a "G" state in an ascending order of the threshold voltages. In the TLC mode, 3-bit data different from each other are assigned to the threshold voltage distributions of the "ER" state to the "G" state, respectively.

When the QLC mode (i.e., 4 bit/cell) is used, the threshold voltages of the plurality of memory cell transistors MT form 16 threshold voltage distributions. The sixteen threshold voltage distributions are referred to as, for example, the "ER" state, the "A" state, the "B" state, the "C" state, the "D" state, the "E" state, the "F" state, the "G" state, an "H" state, an "I" state, a "J" state, a "K" state, an "L" state, an "M" state, am "N" state, and an "O" state in an ascending order of the threshold voltages. In the QLC mode, 4-bit data different from each other are assigned to the threshold voltage distributions of the "ER" state to the "O" state, respectively.

In each write mode, the respective read voltages are set between adjacent threshold voltage distributions. Specifically, a read voltage AR is set between the maximum threshold voltage in the "ER" state and the minimum threshold voltage in the "A" state. Likewise, a read voltage BR is set between the "A" state and the "B" state, a read voltage CR is set between the "B" state and the "C" state, a read voltage DR is set between the "C" state and the "D" states, a read voltage ER is set between the "D" state and the "E" state, a read voltage FR is set between the "E" state and the "F" state, a read voltage GR is set between the "F" state and the "G" state, a read voltage HR is set between the "G" state and the "H" state, a read voltage IR is set between the "H" state and the "I" state, a read voltage JR is set between the "I" state and the "J" state, a read voltage KR is set between the "J" state and the "K" state, a read voltage LR is set between the "K" state and the "L" state, a read voltage MR is set between the "L" state and the "M" state, a read voltage NR is set between the "M" state and the "N" state, and a read voltage OR is set between the "N" state and the "O" state.

In each write mode, a read pass voltage Vread is set to a voltage higher than the maximum threshold voltage in the highest threshold voltage distribution. The memory cell transistor MT to which the read pass voltage Vread is applied to a gate thereof is turned on regardless of the data to be stored.

In each write mode, respective verify voltages are set between adjacent threshold voltage distributions. Specifically, in the write operation, verify voltages AV, BV, CV, DV, EV, FV, GV, HV, IV, JV, KV, LV, MV, NV, and OV are used for verify operations of the "A" state, the "B" state, the "C" state, the "D" states, the "E" state, the "F" state, the "G" state, the "H" state, the "I" state, the "J" state, the "K" state, the "L" state, the "M" state, the "N" state, and the "O" state, respectively. For example, the verify voltages AV to OV are set to voltages higher than the read voltages AR to OR, respectively.

The number of bits of the data stored in one memory cell transistor MT described above is an example, and the embodiments are not limited to this. For example, data more than or equal to 5 bits may be stored in the memory cell transistor MT. Each of the read voltage, the read pass voltage, and the verify voltage may be set to the same voltage value in each write mode or may be set to different voltage values.

1.2 Operation

Next, an operation of the memory system according to the first embodiment will be described. In the following description, the selected word line WL is referred to as a selected word line WLsel. Applying a voltage to the word line WL using the voltage generation circuit 16 corresponds to applying the voltage to the word line WL via the row decoder module 18 using the voltage generation circuit 16. It is assumed that the address information ADD received by the semiconductor storage device 10 is transferred to the address register 12B. It is assumed that the command CMD received by the semiconductor storage device 10 is transferred to the command register 12C.

1.2.1 Outline of Write Operation

An outline of the write operation in the memory system according to the first embodiment will be described.

1.2.1.1 Basic Operation

First, a basic operation of the write operation will be described.

In the write operation, the sequencer 14 repeatedly performs a program loop. Each program loop includes a program process and a verify process.

The program process is a process of increasing the threshold voltage of the memory cell transistor MT. In the program process, each sense amplification unit SAU sets the corresponding bit line BL as a write target or a write inhibition, based on the data stored in an internal latch circuit. Then, in the program process, a write voltage VPGM is applied to the selected word line WLsel. The write voltage VPGM is a high voltage capable of increasing the threshold voltage of the memory cell transistor MT and is higher than, for example, the read pass voltage Vread.

If the write voltage VPGM is applied to the selected word line WLsel, the threshold voltage of the memory cell transistor MT connected to the selected word line WLsel and connected to the bit line BL which is a write target increases. Meanwhile, the threshold voltage of the memory cell transistor MT connected to the selected word line WLsel and connected to the bit line BL in which write is inhibited, is prevented from increasing by a self-boost. A series of those operations corresponds to the program process. If the program process ends, the sequencer 14 shifts to a verify process.

The verify process is a type of read operation of determining whether or not the threshold voltage of the memory cell transistor MT reaches a desirable value. For example, a verify voltage for determining whether the verify process has passed or not, is set for each sense amplification unit SAU according to the write data stored by each sense amplification unit SAU.

If the verify voltage is applied to the selected word line WLsel, each sense amplification unit SAU determines whether or not the threshold voltage of the memory cell transistor MT connected to the selected word line WLsel exceeds the verify voltage, based on a voltage of the corresponding bit line BL. Then, the sense amplification unit SAU stores the determination result in any internal latch circuit. For example, when a threshold voltage of the memory cell transistor MT to which data of the "A" state is written exceeds the verify voltage AV, the sequencer 14 determines that the verify process has passed, and when the threshold voltage is lower than or equal to the verify voltage AV, the sequencer 14 determines that the verify process has failed. If the determinations are completed, the sequencer 14 ends the verify process.

A set of the program process and the verify process described above corresponds to one program loop. In the program process of the subsequent program loop, the write voltage VPGM is stepped up. The step-up amount ΔVPGM of the write voltage VPGM may be set to a predetermined value.

A plurality of types, such as AV, BV, CV, . . . , and OV, may be used as the verify voltage according to the write mode and an increase of the threshold voltage. Then, if the sequencer 14 detects that the number of memory cell transistors MT failed in the verify process for a state belonging to the maximum threshold voltage distribution in the applied write mode during repetition of the program loop is less than a predetermined number, the write operation ends.

1.2.1.2 Setting Process of Initial Write Voltage

Next, a setting process of an initial write voltage in the above-described write operation will be described. The memory controller 30 sets the write voltage VPGM applied in a first program loop (i.e., initial write voltage IVPGM) by referring to an initial write voltage management table stored in the memory 32 at the time of the write operation.

FIG. 5 is a conceptual diagram illustrating the initial write voltage management table of the memory system according to the first embodiment. As illustrated in FIG. 5, the initial write voltage management table stores a value of the initial write voltage IVPGM for each group that is a unit of the write operation. More specifically, the initial write voltage IVPGM is classified and stored for each chip Chip, for each block BLK, for each word line WL, and for each string unit SU. Hereinafter, a unit in which the initial write voltage IVPGM is set in the initial write voltage management table is referred to as a "group".

In the example of FIG. 5, data "00" is set in the plurality of memory cell transistors MT which belong to the string units SU0 and SU1 and are connected to the word line WL0 in the block BLK0 of the chip Chip0. When the data stored in the initial write voltage management table is "00", it indicates that valid data is not stored ("no data") in the initial write voltage management table. In this case, an initial write voltage VPGM0 set as a default may be applied as the initial write voltage IVPGM applied to each of the groups.

Meanwhile, in the example of FIG. 5, "VPGM0+kΔVPGM" (k is an integer greater than or equal to 0) is set to the plurality of memory cell transistors MT which belong to the string unit SU2 and are connected to the word line WL0 in the block BLK0 of the chip Chip0. In addition, "VPGM0+(k+1)ΔVPGM" is set to the plurality of memory cell transistors MT belonging to the string unit SU3. In this case, the voltages, VPGM0+kΔVPGM and VPGM0+(k+1)ΔVPGM, are applied to the groups corresponding to the string units SU2 and SU3, respectively, as the initial write voltage IVPGM.

As such, the memory controller 30 sets a value of the initial write voltage IVPGM for each group classified in write units by referring to the initial write voltage management table. The initial write voltage management table manages a value corresponding to the initial write voltage IVPGM by storing an offset value from the initial write voltage VPGM0 set as a default.

In addition, in the example of FIG. 5, the total number of writes and/or erasures (hereinafter called "the number of W/E") are stored together with the initial write voltage IVPGM or a value corresponding to the initial write voltage IVPGM. The number of W/E is used to monitor a change in characteristics (e.g., increase characteristics of the threshold voltage of the memory cell transistor MT) according to a use situation of the memory cell array 17. Details of a management method of the initial write voltage IVPGM in which the number of W/E is used will be described below.

Figure 6:
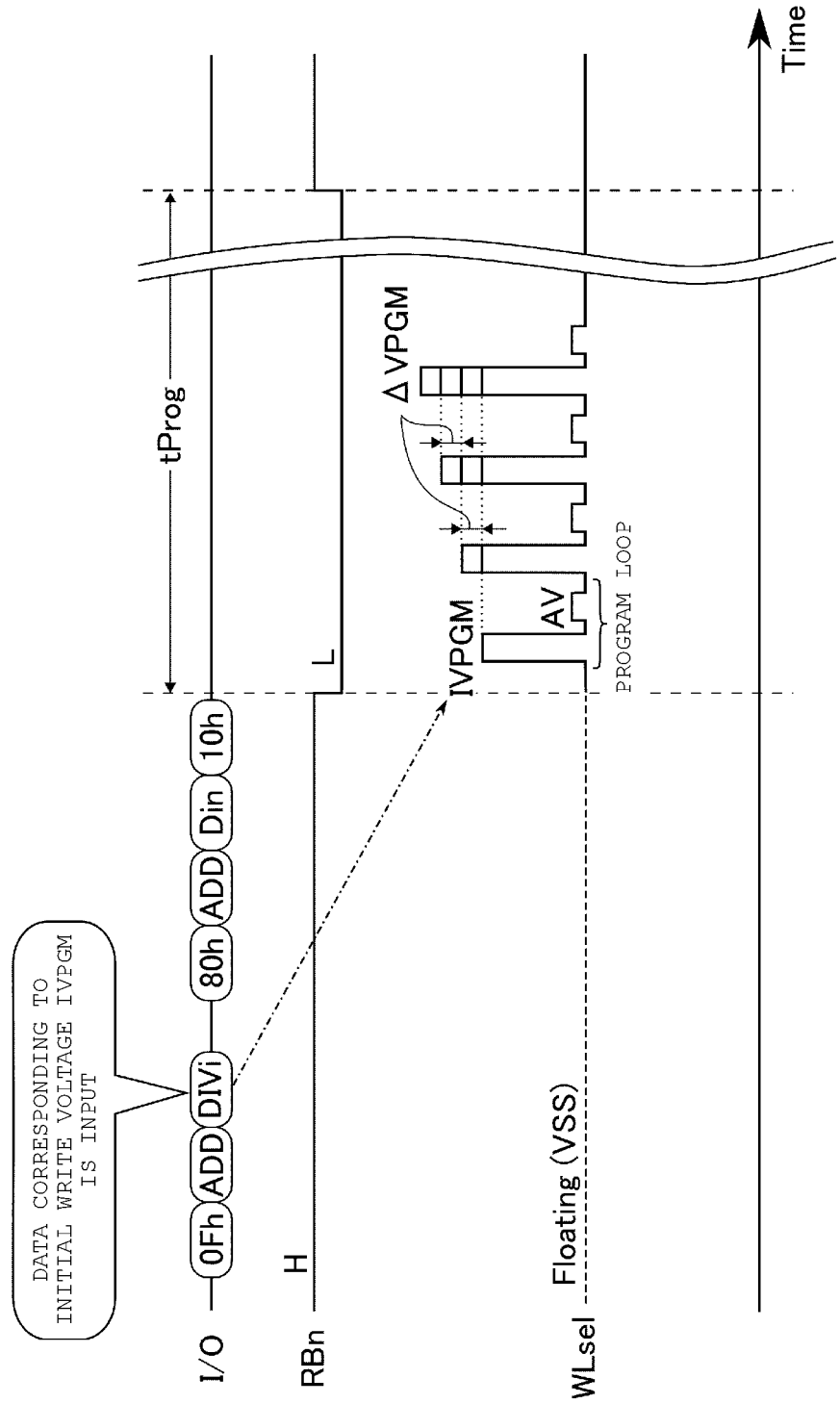
FIG. 6 is a command sequence and a timing chart illustrating a write operation of the memory system according to the first embodiment.

FIG. 6 is an example of a command sequence and a timing chart illustrating the outline of the write operation of the memory system according to the first embodiment. In the same drawing referred to below, it is assumed that a ready/busy signal RBn prior to each process is at an "H" level, and a voltage of the selected word line WLsel is VSS (for example, 0 V). The voltage of the selected word line WLsel prior to each process is not limited to VSS, and may be, for example, floating. That is, the voltage of the selected word line WLsel prior to each process may be set to any voltage value.

As illustrated in FIG. 6, in the write operation, the memory controller 30 sequentially transmits, for example, a command "0Fh", address information "ADD", and initial write voltage data "DIVi" to the semiconductor storage device 10. The command "0Fh" is a command indicating transmission of the initial write voltage data "DIVi". The Initial write voltage data "DIVi" indicates a value of the initial write voltage IVPGM in a subsequent write operation. If receiving the command "0Fh", the sequencer 14 recognizes that a write voltage corresponding to the initial write voltage data "DIVi" is applied to the selected word line WLsel in a first program loop of the subsequent write operation.

Subsequently, the memory controller 30 sequentially transmits a command "80h", the address information "ADD", write data "Din", and a command "10h" to the semiconductor storage device 10. The command "80h" is a command instructing the write operation. The write data "Din" is transferred to a latch circuit XDL of the sense amplification unit SAU in the sense amplification module 19. The command "10h" is a command instructing performance of the write operation.

If receiving the command "10h", the semiconductor storage device 10 shifts from a ready state to a busy state. Then, the sequencer 14 performs the write operation based on the initial write voltage data "DIVi", the command stored in the command register 12C, and the data stored in the sense amplification module 19.

As described above, in the example of FIG. 6, the sequencer 14 sets the value of the initial write voltage IVPGM, based on the initial write voltage data "DIVi". As such, the memory controller 30 can set the initial write voltage IVPGM to any value according to the command "0Fh" and the initial write voltage data "DIVi".

Then, the write voltage VPGM is stepped up for each program loop. For example, when VPGM0+kΔVPGM is set to the initial write voltage IVPGM, the write voltage VPGM in the jth program loop becomes VPGM0+kΔVPGM+(j−1)ΔVPGM (VPGM=IVPGM+(j−1)ΔVPGM) (j is an integer greater than or equal to 1).

At the end of the write operation, the sequencer 14 causes the semiconductor storage device 10 to shift from the busy state to the ready state. The illustrated period tProg corresponds to a time period in which the write operation is performed.

A series of processes is ended by the above-described process.

1.2.2 Management of Initial Write Voltage Management Table

In order to perform the write operation described above, it is desirable that the initial write voltage management table in the memory 32 is updated at an appropriate timing. Management of the initial write voltage management table will be described below. The initial write voltage management table is managed by, for example, an initial setting process and an update process. The initial setting process is a process of learning data to be stored in the initial write voltage management table (hereinafter called "the learning process") and initially storing the learning result in the table as valid data. The update process is a process of verifying whether or not the data in the initial write voltage management table has an optimum value after the initial setting process (hereinafter called "the verification process") and updating the data in the table according to the verification result.

1.2.2.1 Initial Setting Process

An initial setting process of the initial write voltage management table in the memory system according to the first embodiment will be described. The initial setting process is, for example, a process of a test phase performed before the memory system 1 is shipped. In the following description, it is assumed that data "00" is stored, that is, no valid data is stored in the memory 32 in the test phase until the initial setting process is performed.

Figure 7:
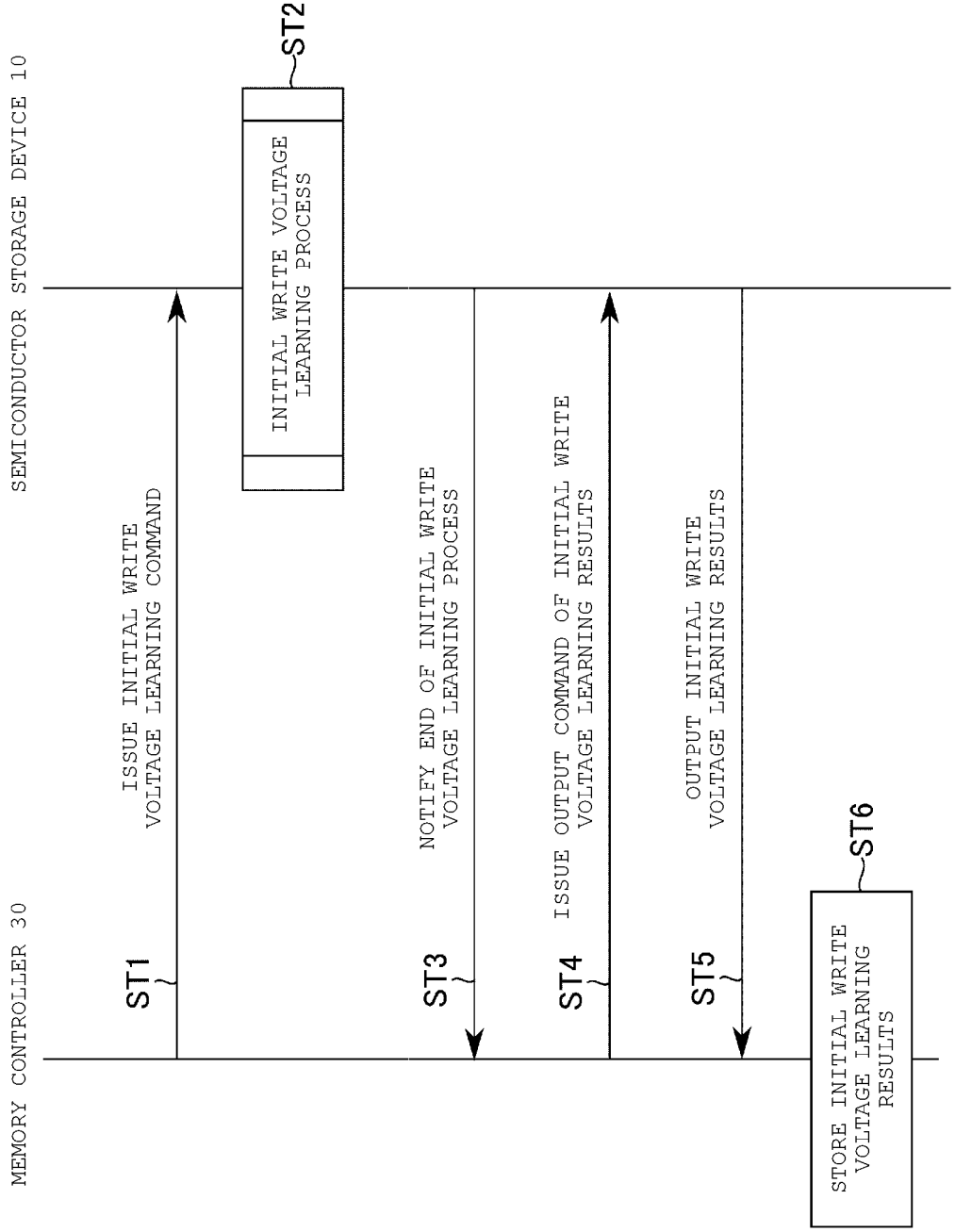
FIG. 7 is a flowchart illustrating an initial setting process of the initial write voltage management table in the memory system according to the first embodiment.

FIG. 7 is a flowchart illustrating the initial setting process of the initial write voltage management table in the memory system according to the first embodiment.

As illustrated in FIG. 7, in step ST1, the memory controller 30 issues a write command set instructing the write operation accompanied by a learning process of the initial write voltage and transmits the issued write command set to the semiconductor storage device 10. In the following description, the "write operation accompanied by the learning process of the initial write voltage" is also referred to as an "initial write voltage learning process", and the "command set for instructing the write operation accompanied by the learning process of the initial write voltage" is also referred to as an "initial write voltage learning command" for the sake of convenient description.

In step ST2, if the initial write voltage learning command is received, the sequencer 14 causes the semiconductor storage device 10 to shift from the ready state to the busy state and performs the initial write voltage learning process. Details of the initial write voltage learning process will be described below.

In step ST3, if the initial write voltage learning process ends, the sequencer 14 causes the semiconductor storage device 10 to shift from the busy state to the ready state, and notifies the memory controller 30 that the initial write voltage learning process ends. The semiconductor storage device 10 stores, for example, information on the initial write voltage IVPGM learned by the process in the register set 12.

In step ST4, if receiving the end notification transmitted in step ST3, the memory controller 30 issues an output command instructing to output learning results of the initial write voltage and transmits the issued output command to the semiconductor storage device 10.

In step ST5, if receiving the output command transmitted in step ST4, the semiconductor storage device 10 refers to the learning results of the initial write voltage stored in the register set 12 and transmits the learning results to the memory controller 30.

In step ST6, the memory controller 30 stores the learning results of the initial write voltage in the initial write voltage management table in the memory 32.

By operating as described above, at the time of the subsequent write operation performed for the same group, the initial write voltage in which the learning results have been reflected may be used by the semiconductor storage device 10 based on the updated initial write voltage management table.

If the test phase ends, the power supply to the memory system 1 may be cut off until the power is turned on after shipment. In this case, the memory controller 30 may transfer information in the initial write voltage management table to the semiconductor storage device 10 during the test phase and store the information in a predetermined region of the memory cell array 17 in a nonvolatile manner. Then, when the power is turned on after shipment, the information may be reloaded from the memory cell array 17 onto the initial write voltage management table in the memory 32 and may be used in the subsequent write operation.

Figure 8:
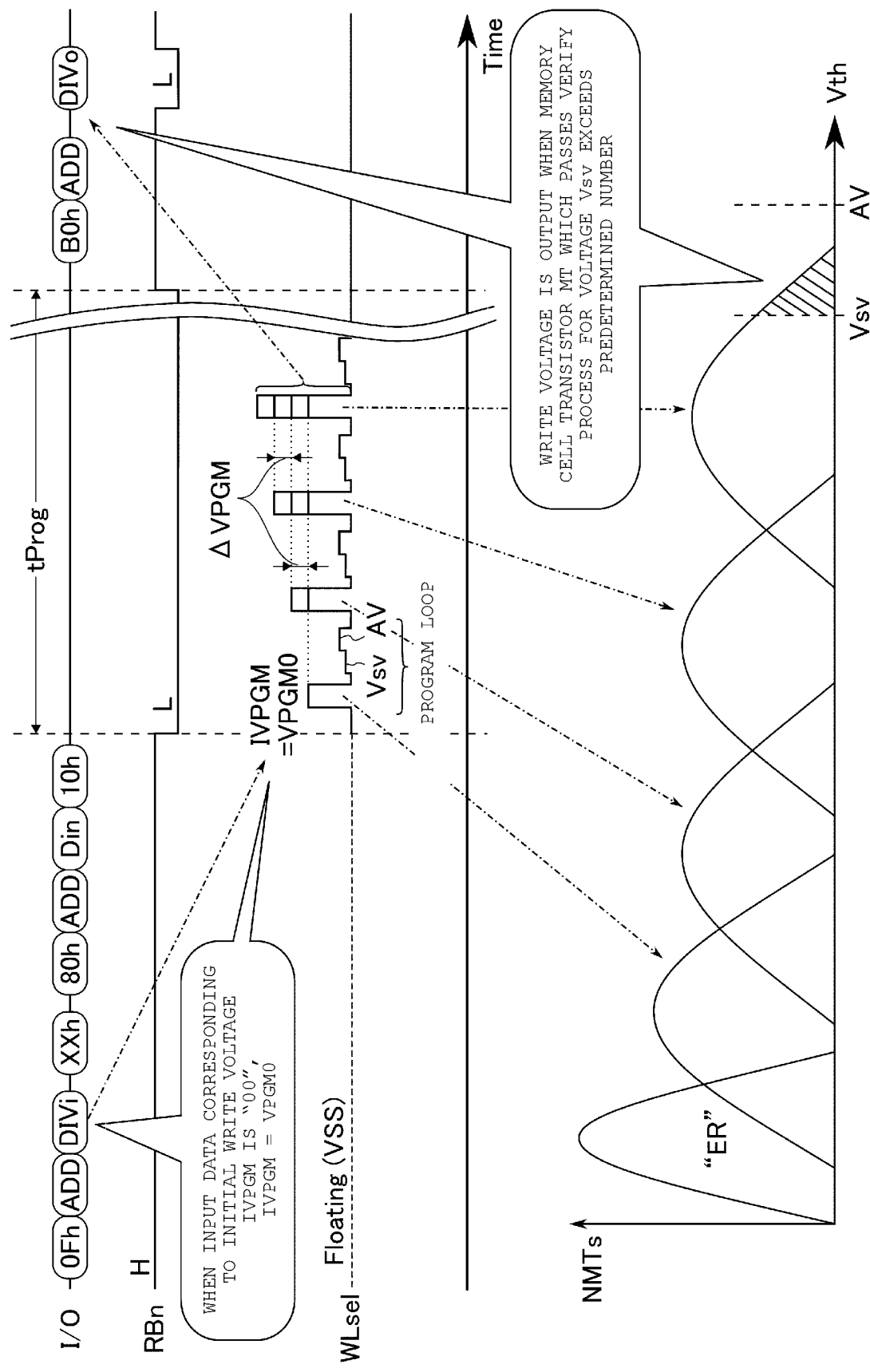
FIG. 8 is a command sequence and timing chart illustrating the initial setting process of the initial write voltage management table in the memory system according to the first embodiment.

FIG. 8 illustrates a command sequence and a timing chart of a series of processes including the initial write voltage learning process and the output process of learning results, in the memory system according to the first embodiment. FIG. 8 also illustrates that the threshold voltage distributions of the plurality of memory cell transistors MT, which are learning targets of the initial write voltage, change for each program loop.

As illustrated in FIG. 8, in the initial write voltage learning process, the memory controller 30 sequentially transmits, for example, the command "0Fh", the address information "ADD", the initial write voltage data "DIVi", and a command "XXh" to the semiconductor storage device 10. The command "XXh" is a command instructing that the learning process of the initial write voltage is performed together in the write operation.

As described above, in the test phase, valid data is not stored in the initial write voltage management table of the memory 32 until the initial write voltage learning process is performed. Accordingly, the memory controller 30 transmits data "00" to the semiconductor storage device 10 as the initial write voltage data "DIVi". If receiving the data "00" as the initial write voltage data "DIVi" together with the command "XXh", the sequencer 14 recognizes that the default initial write voltage VPGM0 is applied as the initial write voltage IVPGM in the write operation accompanied by the initial write voltage learning process.

Subsequently, the memory controller 30 sequentially transmits a command "80h", the address information "ADD", the write data "Din", and a command "10h" to the semiconductor storage device 10.

If receiving the command "10h", the semiconductor storage device 10 shifts from the ready state to the busy state. Then, the sequencer 14 performs the initial write voltage learning process based on the initial write voltage data "DIVi" indicating the data "00", a command set including the command "XXh", and the write data "Din".

Specifically, the write operation accompanied by the learning process of the initial write voltage includes, for example, a program process and a verify process. In the program process of a first program loop, the sequencer 14 applies the default initial write voltage VPGM0 to the selected word line WLsel based on the initial write voltage data "DIVi" of the data "00". Since the default initial write voltage VPGM0 is a voltage to which the step-up amount ΔVPGM is not added, the default initial write voltage VPGM0 may be, for example, a minimum value of the write voltage VPGM. Accordingly, a threshold voltage distribution of the plurality of memory cell transistors MT corresponding to the "ER" state gradually approaches the verify voltage AV in a plurality of program loops without immediately approaching the vicinity of the verify voltage AV in the first program loop.

Meanwhile, in the verify process of the write operation accompanied by the initial write voltage learning process, the verify process for a verify voltage Vsv is performed together with the verify voltage AV (or prior to the verify voltage AV) from the first program loop. The verify voltage Vsv is, for example, a verify voltage for initial write voltage learning, and set to a voltage equal to or lower than the verify voltage AV.

In the example of FIG. 8, the first to fourth program loops are illustrated, and in the verify process in each of the program loops, the verify voltages Vsv and AV are sequentially applied to the selected word line WLsel. In the verify process for the verify voltage Vsv, if the verify voltage Vsv is applied to the selected word line WLsel, each sense amplification unit SAU determines whether or not the threshold voltage of the memory cell transistor MT connected to the selected word line WLsel exceeds the verify voltage Vsv, based on a voltage of the corresponding bit line BL. Then, the sense amplification unit SAU stores the determination results in any internal latch circuit. For example, when the threshold voltage of the memory cell transistor MT which is a learning target of the initial write voltage exceeds the verify voltage Vsv, the sequencer 14 determines that the verify process has passed for initial write voltage learning. Meanwhile, when the threshold voltage of the memory cell transistor MT which is a learning target of the initial write voltage is lower than or equal to the verify voltage Vsv, the sequencer 14 determines that the verify process has failed for the initial write voltage learning.

If the sequencer 14 detects that the number of memory cell transistors MT which pass the verify process for the verify voltage Vsv exceeds a predetermined number, the sequencer 14 stores the write voltage VPGM applied to the selected word line WLsel in the program process in the program loop in which the detection is performed. In the example of FIG. 8, a predetermined number of threshold voltages of the plurality of memory cell transistors MT which are initial write voltage learning targets exceeds the verify voltage Vsv in the program process in the fourth program loop. In this case, the sequencer 14 stores in the register set 12 the write voltage VPGM=VPGM0+3ΔVPGM applied to the selected word line WLsel in the program process in the fourth program loop.

Thereafter, the sequencer 14 continuously performs a normal write operation according to the write data "Din", and causes the semiconductor storage device 10 to shift from the busy state to the ready state if the write operation ends. That is, the sequencer 14 transmits an end notification of the initial write voltage learning process to the memory controller 30.

Subsequently, the memory controller 30 issues an output command "B0h" and the address information "ADD" and transmits the issued output command to the semiconductor storage device 10. If receiving the output command "B0h", the sequencer 14 causes the semiconductor storage device 10 to shift from the ready state to the busy state and transmits data "DIVo" to the memory controller 30. The data "DIVo" includes information indicating the write voltage VPGM in the number of program loops determined that the number of memory cell transistors MT which pass the verify process for the verify voltage Vsv exceeds a predetermined number. In the example of FIG. 8, the sequencer 14 transmits the information indicating the write voltage VPGM=VPGM0+3ΔVPGM to the memory controller 30 as the data "DIVo". If the transmission of the data "DIVo" ends, the sequencer 14 causes the semiconductor storage device 10 to shift from the busy state to the ready state and ends the output process of the learning results.

If receiving the data "DIVo" from the semiconductor storage device 10, the memory controller 30 updates the initial write voltage IVPGM of a group corresponding to the memory cell transistor MT which is an initial setting target in the initial write voltage management table to the data "DIVo".

By operating as described above, the memory controller 30 can initialize the learning results of the initial write voltage in the management table in the memory 32.

1.2.2.2 Update Process

Next, an update process of the initial write voltage management table in the memory system according to the first embodiment will be described. The update process is, for example, a process of an actual operation phase which is performed after shipping the memory system 1. In the following description, it is assumed that the memory system 1 has performed an initial setting process of the initial write voltage management table in the test phase, and valid data has been stored in the table.

Figure 9:
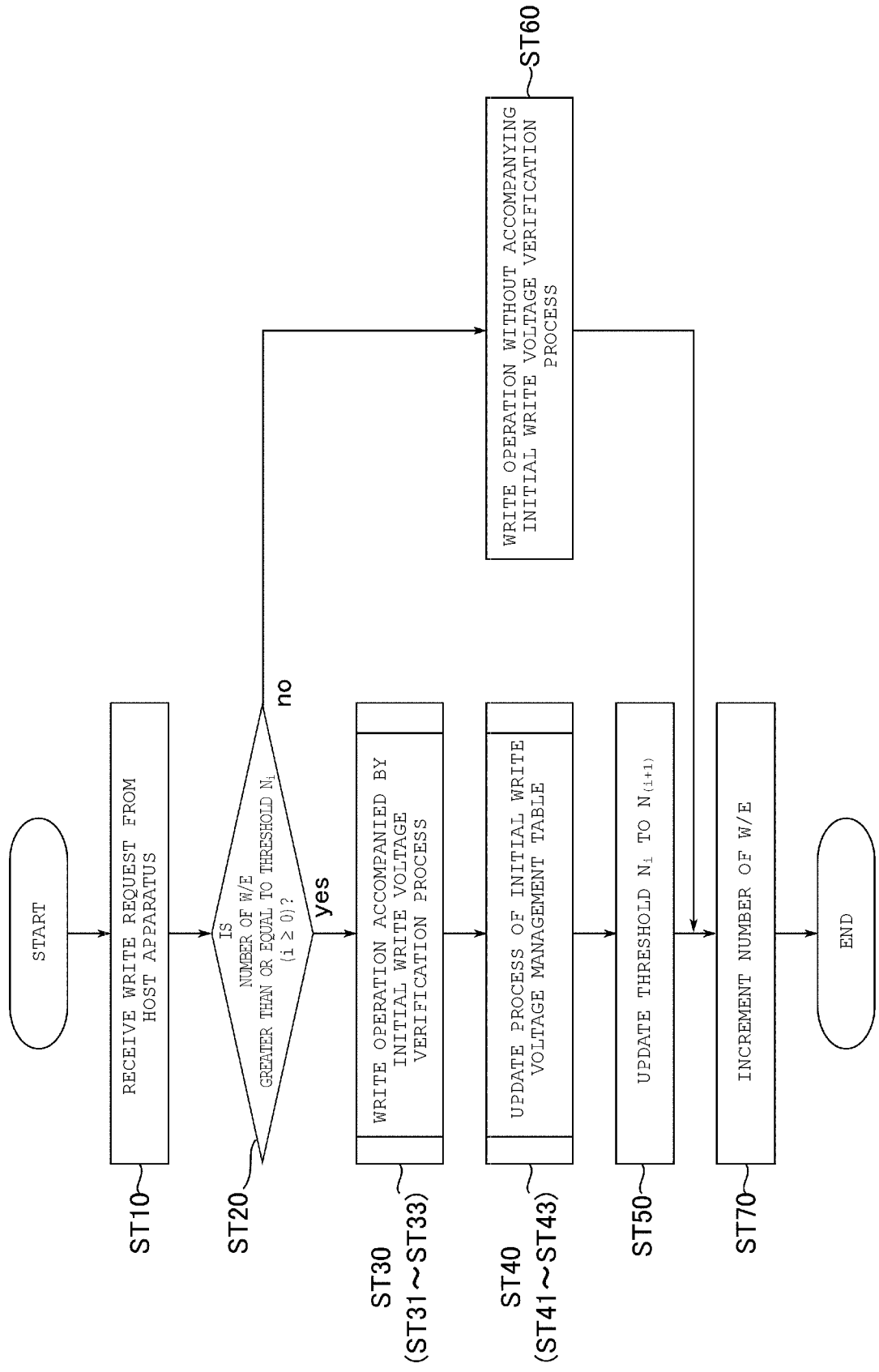
FIG. 9 is a flowchart illustrating an overview of an update process of the initial write voltage management table in the memory system according to the first embodiment.

FIG. 9 is a flowchart illustrating an outline of the update process of the initial write voltage management table in the memory system according to the first embodiment.

As illustrated in FIG. 9, in step ST10, the memory controller 30 receives a write request from the host apparatus 2 during the actual operation phase.

In step ST20, the memory controller 30 determines whether or not the number of W/E corresponding to a group of the plurality of memory cell transistors MT that are write targets is greater than or equal to a predetermined threshold $N_i$ (i is an integer greater than or equal to 0) with reference to the initial write voltage management table in the memory 32. That is, the memory controller 30 determines whether or not the number of W/E is greater than or equal to a threshold $N_0$ when i=0, and determines whether or not the number of W/E is greater than or equal to the thresholds $N_1$, $N_2$, $N_3$, . . . when i=1, 2, 3, . . . .

The threshold $N_i$ is managed in association with the number of W/E, for example, in the initial write voltage management table illustrated in FIG. 5. In the example of FIG. 9, the threshold value $N_i$ is set such that N becomes a greater value when i is incremented, i.e., $N_0 < N_1 < N_2 < N_3 < \ldots$ .

When it is determined that the number of W/E is greater than or equal to the threshold $N_i$ (step ST20; yes), the process proceeds to steps ST30 to ST50.

Step ST30 includes steps ST31 to ST33. In step ST30, the memory controller 30 and the semiconductor storage device 10 perform the write operation accompanied by the verification process of the initial write voltage, and the process proceeds to step ST40.

Step ST40 includes steps ST41 to ST43. In step ST40, the memory controller 30 and the semiconductor storage device 10 perform the update process of the initial write voltage management table based on the verification process results, and the process proceeds to step ST50. Details of the write operation accompanied by the verification process of the initial write voltage and the update process of the initial write voltage management table (that is, steps ST31 to ST33 and steps ST41 to ST43) will be described below.

In step ST50, the memory controller 30 updates the threshold value from $N_i$ to $N_{(i+1)}$ ($>N_i$), which is used for determining whether to execute the update process for a subsequent new write request from the host apparatus 2, and the process proceeds to step ST70. Thereby, after steps ST30 and ST40 are performed, if the new write request is received from the host apparatus 2 for the same group, the memory controller 30 may compare the number of W/E with the threshold $N_{(i+1)}$ in step ST20 for the new write request.

Meanwhile, when it is determined in step ST20 that the number of W/E is smaller than the threshold $N_i$ (step ST20; no), the process proceeds to step ST60.

In step ST60, the memory controller 30 and the semiconductor storage device 10 perform the write operation without accompanying the update process of the initial write voltage, and the process proceeds to step ST70. In this case, the initial write voltage management table in the memory 32 is not updated. Thus, after step ST60 is performed, if a new write request is received from the host apparatus 2 for the same group, the memory controller 30 compares the number of W/E with the threshold $N_i$ in step ST20 for the new write request.

In step ST70, the memory controller 30 increments the number of W/E associated with the group corresponding to the write target with reference to the initial write voltage management table.

By operating as described above, the semiconductor storage device 10 performs the write operation accompanied by the verification process of the initial write voltage each time the number of W/E reaches a certain number, and as a result, the initial write voltage management table in the memory 32 can be updated.

Next, details of a flow of the update process of the initial write voltage management table in the memory system according to the first embodiment will be described.

Figure 10:
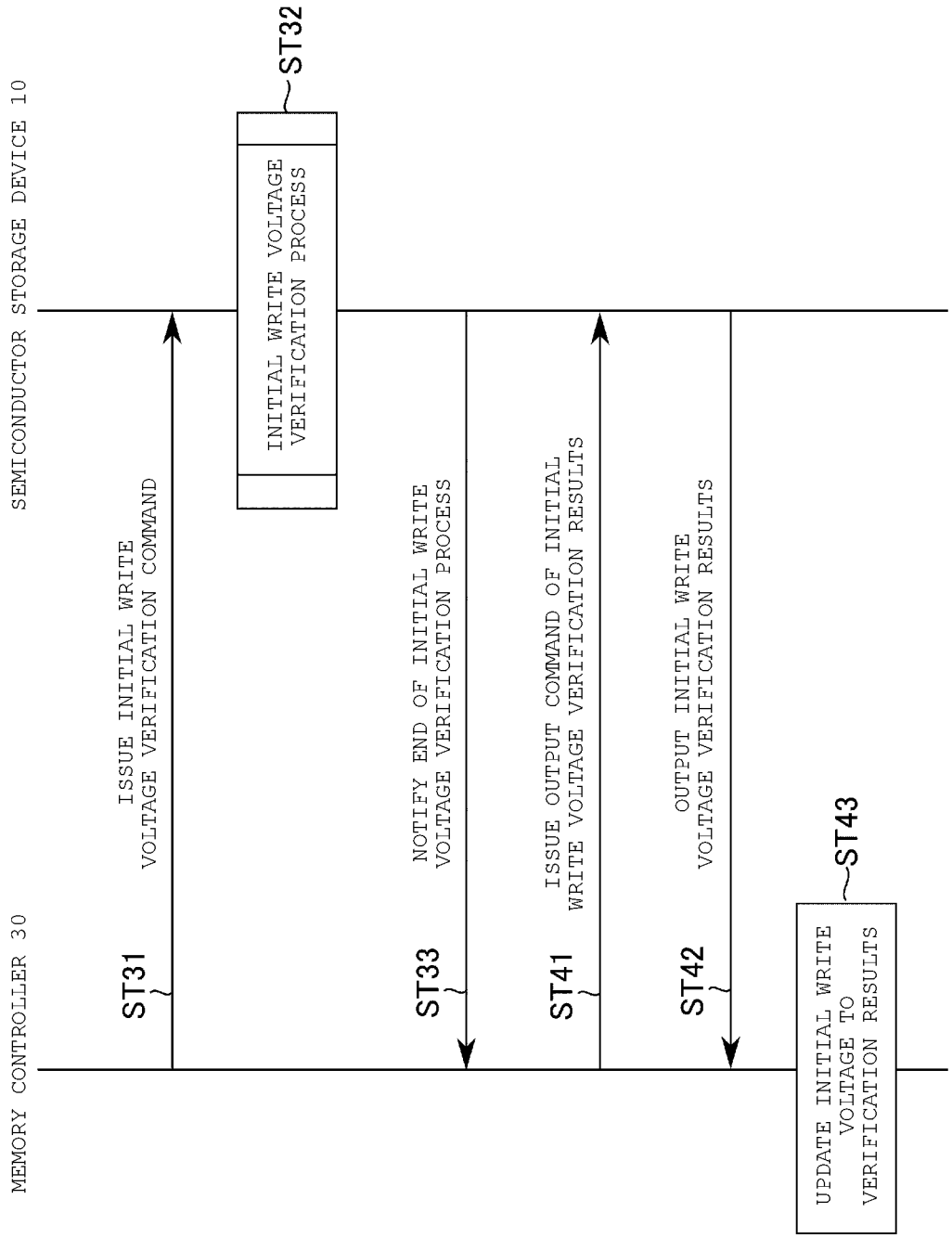
FIG. 10 is a flowchart illustrating details of the update process of the initial write voltage management table in the memory system according to the first embodiment.

FIG. 10 is a flowchart illustrating the details of the update process of the initial write voltage management table in the memory system according to the first embodiment.

As illustrated in FIG. 10, in step ST31, the memory controller 30 issues a write command set instructing the write operation accompanied by the verification process of the initial write voltage and transmits the issued write command set to the semiconductor storage device 10. In the following description, "the write operation accompanied by the verification process of the initial write voltage" is also referred to as "an initial write voltage verification process", and "the command set instructing the write operation accompanied by the initial write voltage verification process" is also referred to as "an initial write voltage verification command" for the sake of convenient description.

In step ST32, if receiving the initial write voltage verification command, the sequencer 14 causes the semiconductor storage device 10 to shift from the ready state to the busy state and performs the initial write voltage verification process.

In step ST33, if the initial write voltage verification process ends, the sequencer 14 causes the semiconductor storage device 10 shift from the busy state to the ready state and notifies the memory controller 30 that the initial write voltage verification process ends. The semiconductor storage device 10 stores, for example, information on the initial write voltage IVPGM learned by the process in the register set 12.

In step ST41, if receiving the end notification transmitted in step ST33, the memory controller 30 issues an output command instructing output of verification results of the initial write voltage and transmits the output command to the semiconductor storage device 10.

In step ST42, if receiving the output command transmitted in step ST41, the semiconductor storage device 10 refers to the verification results of the initial write voltage stored in the register set 12 and transmits the verification results to the memory controller 30.

In step ST43, the memory controller 30 updates the initial write voltage management table in the memory 32 using the verification results of the initial write voltage.

By operating as described above, at the time of the subsequent write operation performed for the same group, the initial write voltage in which the verification results have been reflected can be transmitted to the semiconductor storage device 10 with reference to the initial write voltage management table.

Figure 11:
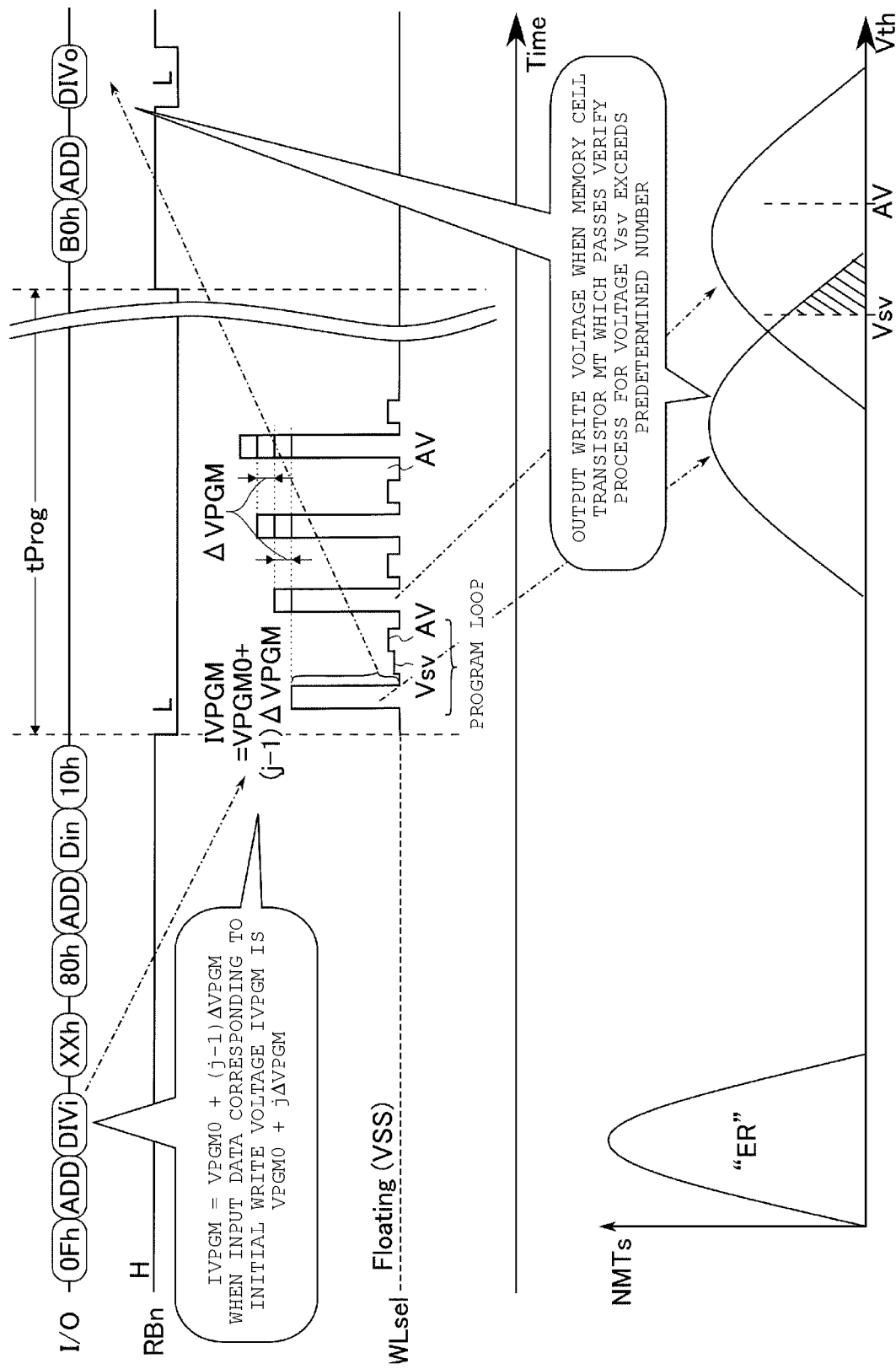
FIG. 11 is a command sequence and a timing chart illustrating the update process of the initial write voltage management table in the memory system according to the first embodiment.

FIG. 11 illustrates a command sequence and a timing chart of a series of processes including the initial write voltage verification process and the output process of the verification results in the memory system according to the first embodiment. FIG. 11 illustrates together changes for each program loop of the threshold voltage distribution of the plurality of memory cell transistors MT which is a verification target of the initial write voltage.

As illustrated in FIG. 11, in the initial write voltage verification process, the memory controller 30 sequentially transmits, for example, the command "0Fh", the address information "ADD", the initial write voltage data "DIVi", and a command "XXh" to the semiconductor storage device 10. The command "XXh" is a command for instructing to perform the verification process of the initial write voltage together in the write operation.

As described above, in the actual operation phase, valid data (for example, VPGM0+j$\Delta$VPGM) is stored in the initial write voltage management table of the memory 32. Accordingly, the memory controller 30 transmits the data "VPGM0+j$\Delta$VPGM" to the semiconductor storage device 10 as the initial write voltage data "DIVi". If receiving the data "VPGM0+j$\Delta$VPGM" as the initial write voltage data "DIVi" together with the command "XXh", the sequencer 14 recognizes that a voltage lower than the voltage VPGM0+j$\Delta$VPGM is applied as the initial write voltage IVPGM in the write operation accompanied by the initial write voltage verification process. For example, if receiving the command "XXh", the sequencer 14 recognizes that a voltage VPGM0+(j−1)$\Delta$VPGM lower by $\Delta$VPGM than the voltage corresponding to the initial write voltage data "DIVi" is applied to the initial write voltage IVPGM.

Subsequently, the memory controller 30 sequentially transmits the command "80h", the address information "ADD", the write data "Din", and the command "10h" to the semiconductor storage device 10. The initial write voltage verification process is the same process as the initial write voltage learning process except a magnitude of the initial write voltage IVPGM. Accordingly, as described above, the command "XXh", which is the same as a command instructing to perform the learning process of the initial write voltage together in the write operation, may be used for a command instructing to perform the verification process of the initial write voltage together in the write operation.

If receiving the command "10h", the semiconductor storage device 10 shifts from the ready state to the busy state. Then, the sequencer 14 performs the initial write voltage verification process based on the initial write voltage data "DIVi" of the data "00", a command set including the command "XXh", and the write data "Din".

Specifically, the verification process of the initial write voltage includes, for example, the program process and the verify process. In the program process of the first program loop, the sequencer 14 applies the initial write voltage IVPGM=VPGM0+(j−1)ΔVPGM to the selected word line WLsel based on the valid initial write voltage data "DIVi". Accordingly, the threshold voltage distribution of the plurality of memory cell transistors MT corresponding to the "ER" state immediately approaches the verify voltage Vsv in the first program loop.

Meanwhile, in the verification process of the initial program voltage verify process, the verify process for the verify voltage Vsv is performed together with the verify voltage AV (or prior to the verify voltage AV) from the first program loop.

In the example of FIG. 11, the first to fourth program loops are illustrated, and a case where the verify process for the verify voltage Vsv ends in the first program loop is illustrated. That is, in the example of FIG. 11, a predetermined number of threshold voltages of the plurality of memory cell transistors MT which are initial write voltage verification targets exceed the verify voltage Vsv in the program process of the first program loop. In this case, the sequencer 14 stores in the register set 12 the write voltage VPGM=VPGM0+(j−1)ΔVPGM applied to the selected word line WLsel in the program process of the first program loop.

Thereafter, the sequencer 14 continuously performs the regular write operation according to the write data "Din", and causes the semiconductor storage device 10 to shift from the busy state to the ready state if the write operation ends. In addition, the sequencer 14 transmits an end notification of the initial write voltage learning process to the memory controller 30.

Subsequently, the memory controller 30 issues the output command "B0h" and the address information "ADD" and transmits the output command and the address information to the semiconductor storage device 10. If receiving the output command "B0h", the sequencer 14 causes the semiconductor storage device 10 to shift from the ready state to the busy state and transmits the data "DIVo" to the memory controller 30 based on the verification process results of the initial write voltage. In the example of FIG. 11, the sequencer 14 transmits information indicating the write voltage VPGM=VPGM0+(j−1)ΔVPGM to the memory controller 30 as the data "DIVo". If the transmission of the data "DIVo" ends, the sequencer 14 causes the semiconductor storage device 10 to shift from the busy state to the ready state and ends the output process of the verification results.

By operating as described above, the memory controller can update information in the initial write voltage management table from "VPGM0+jΔVPGM" to "VPGM0+(j−1)ΔVPGM" based on the verification results of the initial write voltage.

1.3 Effect of Present Embodiment

According to the first embodiment, when the write operation is performed, the memory controller 30 designates the initial write voltage IVPGM in the first program loop by outputting the data "DIVi". In addition, the memory controller 30 updates the data "DIVi" according to the number of W/E for the plurality of memory cell transistors MT which are write targets. Thereby, the memory controller 30 can start the write operation from the optimum initial write voltage IVPGM according to threshold voltage increase characteristics of the plurality of memory cell transistors MT which are write targets.

Figure 12:
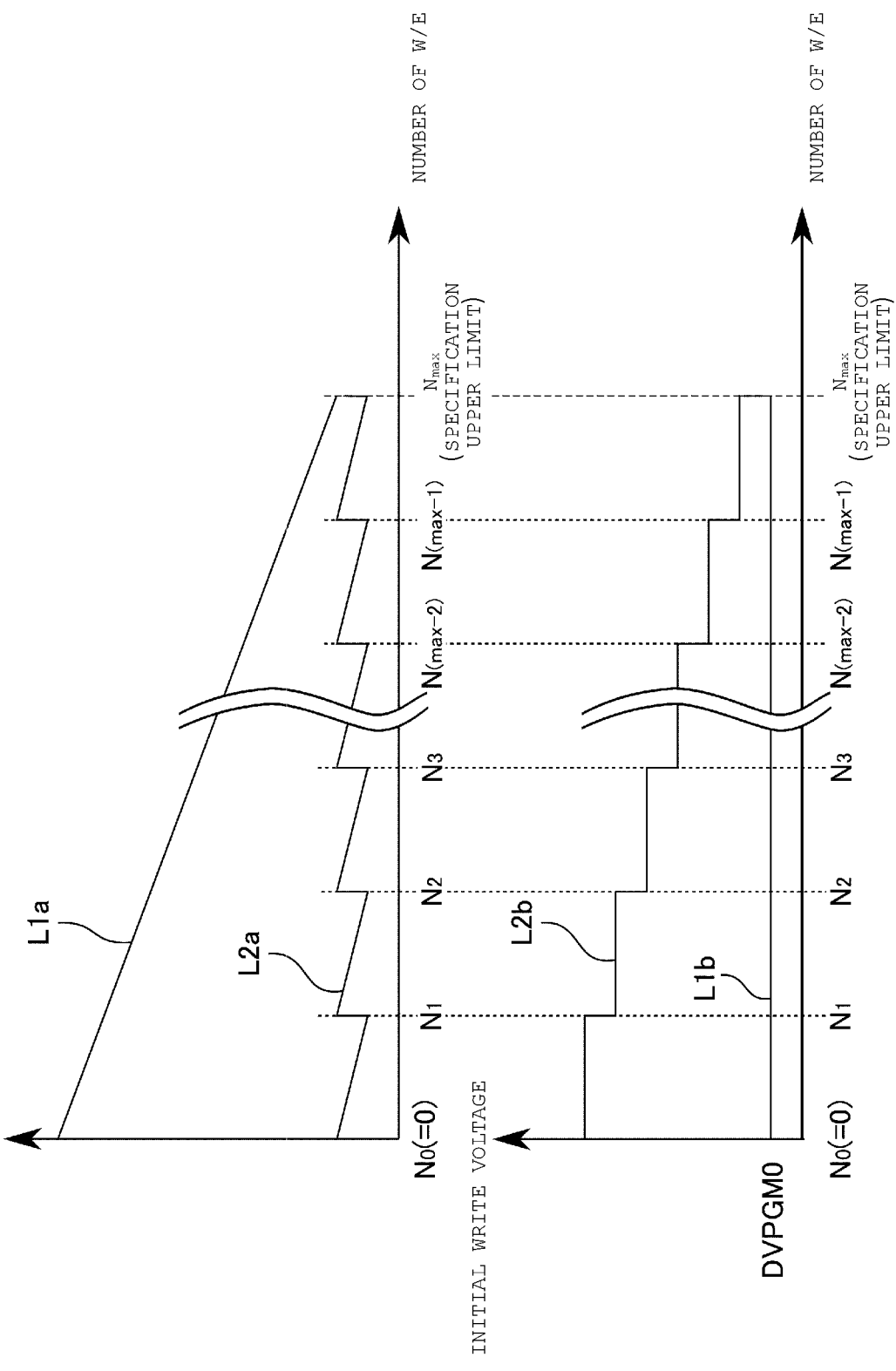
FIG. 12 is a diagram illustrating an effect according to the first embodiment.

FIG. 12 is a diagram illustrating an effect of the memory system according to the first embodiment. FIG. 12 illustrates lines L1 (i.e., L1a and L1b) corresponding to a memory system according to a comparative example and lines L2 (i.e., L2a and L2b) corresponding to the memory system according to the first embodiment. The memory system according to the comparative example corresponds to a case where a constant initial write voltage IVPGM is applied regardless of the number of W/E.

More specifically, an upper part of FIG. 12 illustrates a diagram in which a horizontal axis represents the number of W/E and a vertical axis represents a margin of the initial write voltage with respect to a write voltage that causes excessive write (i.e., a difference between a voltage at which excessive write occurs and the initial write voltage). In the diagram in the upper part of FIG. 12, characteristics of the memory system according to the comparative example are illustrated as the line L1a, and characteristics of the memory system according to the first embodiment are illustrated as the line L2a. A lower part of FIG. 12 illustrates a diagram in which a horizontal axis represents the number of W/E and a vertical axis represents the initial write voltage. In the diagram in the lower part of FIG. 12, the characteristics of the memory system according to the comparative example are illustrated as the line L1b, and the characteristics of the memory system according to the first embodiment are illustrated as the line L2b.

As illustrated in the lower part of FIG. 12, the memory system according to the comparative example applies a constant initial write voltage IVPGM (for example, the default initial write voltage DVPGM0) regardless of the number of W/E, while the memory system according to the first embodiment updates a value of the initial write voltage IVPGM according to the number of W/E. Specifically, when the number of W/E is greater than or equal to the threshold $N_0$ (=0), the memory controller 30 performs an initial setting process of the initial write voltage management table. Thereby, the memory controller 30 can update the initial write voltage IVPGM to a value greater than the default initial write voltage DPVGMO. Thereafter, the threshold $N_0$ is updated to $N_1$ (>$N_0$), and when the number of W/E is greater than or equal to the threshold $N_0$, the memory controller 30 performs the update process of the initial write voltage management table. Thereby, the memory controller 30 can update the initial write voltage IVPGM to a value smaller than or equal to the value stored in the initial write voltage management table.

As illustrated in the upper part of FIG. 12, the memory cell transistor MT changes in increase characteristics of the threshold voltage as the number of W/E increases. Specifically, as indicated by the line L1a, if the number of W/E increases, a margin of the initial write voltage for the write voltage that causes excessive write decreases after the program process in the first program loop. That is, as the number of W/E increases, the threshold voltage of the memory cell transistor MT easily increases. Accordingly, when a constant initial write voltage IVPGM is applied regardless of the number of W/E, the threshold voltage is most likely to increase, and the initial write voltage is set so as not to cause the excessive write even in the number of W/E of an upper limit of a specification. However, the initial write voltage set in this way may have an excessive margin for the write voltage that causes the excessive write when the number of W/E at which the threshold voltage is relatively hard to increase is small.

According to the first embodiment, as indicated by the line L2$a$, the initial write voltage is updated each time the number of W/E (that is, the increase characteristics of the threshold voltage of the memory cell transistor MT) reaches the threshold $N_i$. Thereby, the margin of the initial write voltage IVPGM with respect to the write voltage that causes excessive write can be updated to an appropriate value before the margin is excessively reduced. Accordingly, an increase amount of a threshold voltage of the memory cell transistor MT in the first program loop can be maintained in an optimum state over a life cycle of the semiconductor storage device 10, and an increase in the number of program loops can be suppressed. Thus, it is possible to suppress an increase in the write time regardless of the number of W/E.

The memory controller 30 outputs the command "XXh" to the semiconductor storage device 10 at the time of the initial setting process and the update process. Thereby, the semiconductor storage device 10 can perform the verify process for the verify voltage Vsv if receiving the command "XXh". Accordingly, the semiconductor storage device 10 can specify the write voltage in the program loop in which the verify process for the verify voltage Vsv ends.

The memory controller 30 outputs the command "B0$h$" to the semiconductor storage device 10 after the write operation ends. Thereby, if receiving the command "B0$h$", the semiconductor storage device 10 can output the write voltage specified by the verify process for the verify voltage Vsv to the memory controller 30. Accordingly, the memory controller 30 can obtain the optimum initial write voltage IVPGM.

The memory controller 30 has the initial write voltage management table in the memory 32 and stores the initial write voltage IVPGM corresponding to the data "DIVi" in the table. Thereby, the memory controller 30 can maintain the optimum initial write voltage IVPGM over the life cycle of the semiconductor storage device 10.

2. Second Embodiment

Next, a memory system according to a second embodiment will be described. The second embodiment is different from the first embodiment in that an update process is performed in the memory controller 30 without performing the command "XXh". In the following description, description on the same configuration and operation as in the first embodiment will be omitted, and a configuration and an operation different from the configuration and the operation according to the first embodiment will be mainly described.

2.1 Update Process

An update process of an initial write voltage management table in a memory system according to a second embodiment will be described.

Figure 13:
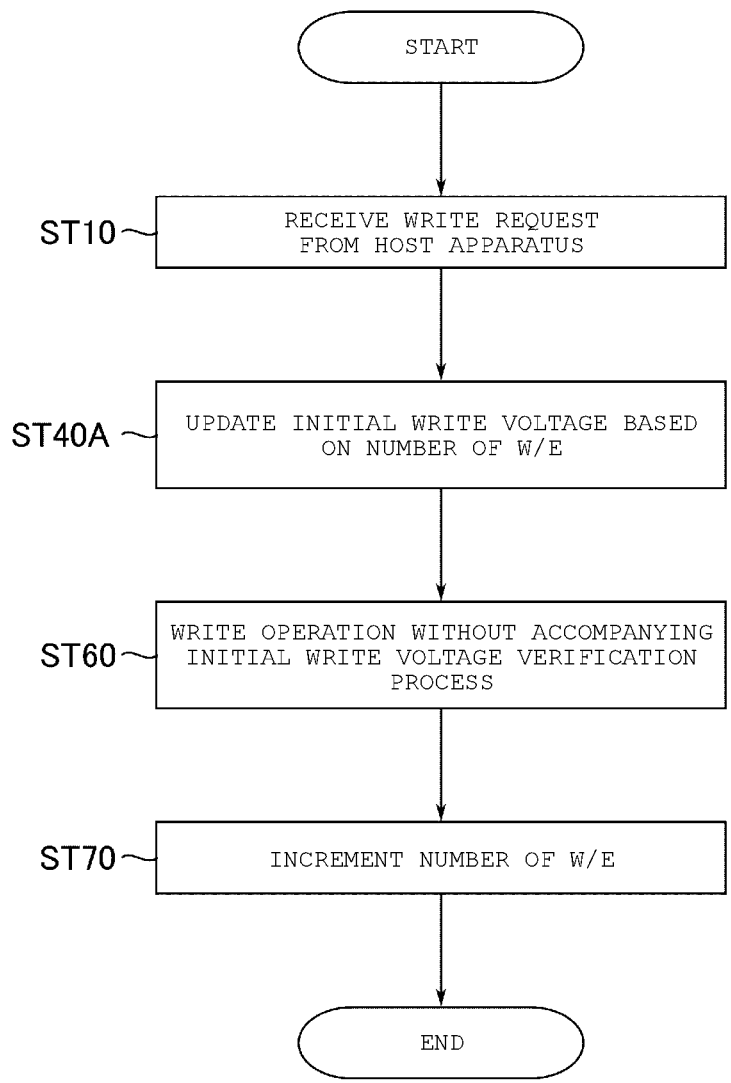
FIG. 13 is a flowchart illustrating an update process of an initial write voltage management table in a memory system according to a second embodiment.

FIG. 13 is a flowchart illustrating the update process of the initial write voltage management table in the memory system according to the second embodiment. FIG. 13 corresponds to FIG. 9 in the first embodiment.

As illustrated in FIG. 13, in step ST10, the memory controller 30 receives a write request from the host apparatus 2 during an actual operation phase.

In step ST40A, the memory controller 30 performs the update process of the initial write voltage management table based on the number of W/E before a write operation is performed. For example, a circuit capable of calculating the initial write voltage IVPGM which uses the number of W/E as a parameter is mounted in the memory controller 30. Thereby, the memory controller 30 can calculate the initial write voltage IVPGM according to the number of W/E with reference to the number of W/E and can update an initial write voltage management table by using the calculated initial write voltage IVPGM.

Subsequently, in step ST60, the memory controller 30 and the semiconductor storage device 10 perform the write operation without the update process of the initial write voltage, and the process proceeds to step ST70. In this case, the write operation is performed with reference to the initial write voltage management table updated in step ST40A.

In step ST70, the memory controller 30 increments the number of W/E associated with a group corresponding to a write target with reference to the initial write voltage management table.

By operating as described above, the initial write voltage management table can be updated according to the number of W/E without performing the write operation accompanied by a verification process of the initial write voltage.

2.2 Effect of Present Embodiment

According to the second embodiment, the memory controller 30 updates the initial write voltage management table based on the number of W/E without issuing the command "XXh". Thereby, the semiconductor storage device 10 can omit performing the verify process for the verify voltage Vsv. Accordingly, it is possible to prevent an increase in write operation time.

Figure 14:
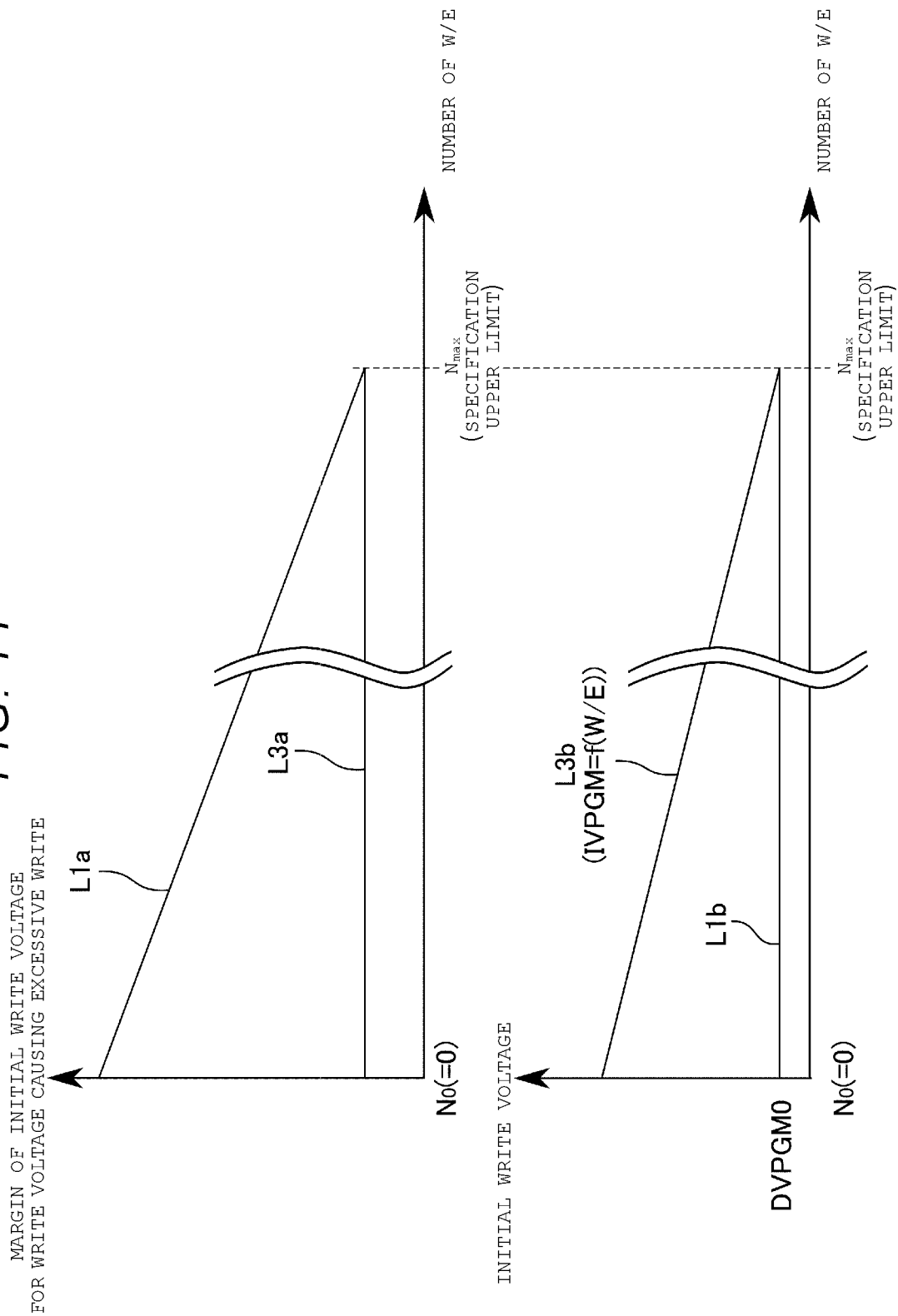
FIG. 14 is a diagram illustrating an effect according to the second embodiment.

FIG. 14 is a diagram illustrating an effect of the memory system according to the second embodiment. FIG. 14 corresponds to FIG. 12 in the first embodiment. FIG. 14 illustrates lines L1 (i.e., L1$a$ and L1$b$) corresponding to a memory system according to a comparative example and lines L3 (i.e., L3$a$ and L3$b$) corresponding to the memory system according to the second embodiment.

More specifically, an upper part of FIG. 14 illustrates a diagram in which a horizontal axis represents the number of W/E and a vertical axis represents a margin of the initial write voltage with respect to the write voltage that causes excessive write. In the diagram in the upper part of FIG. 14, characteristics of the memory system according to the comparative example are illustrated as the line L1$a$, and characteristics of the memory system according to the second embodiment are illustrated as the line L3$a$. A lower part of FIG. 14 illustrates a diagram in which a horizontal axis represents the number of W/E and a vertical axis represents the initial write voltage. In the diagram in the lower part of FIG. 14, the characteristics of the memory system according to the comparative example are illustrated as the line L1$b$, and the characteristics of the memory system according to the second embodiment are illustrated as the line L3$b$.

As illustrated in the lower part of FIG. 14, the memory system according to the comparative example has a constant initial write voltage IVPGM regardless of the number of W/E, while the memory system according to the second embodiment updates the value of the initial write voltage IVPGM for each write operation according to the number of W/E. Specifically, a circuit capable of calculating IVPGM by using W/E as a parameter (i.e., functioning as a function f which can perform IVPGM=f(W/E)) is mounted in the memory controller 30. Thereby, the memory controller 30 can calculate the initial write voltage IVPGM for each write operation and can update the initial write voltage management table.

Thereby, as indicated by the line L3a in the upper part of FIG. 12, the memory controller 30 can take an appropriate margin for the write voltage constantly becoming an overwriting regardless of the number of W/E. Accordingly, regardless of the number of W/E, a threshold voltage increase amount of the memory cell transistor MT in the first program loop can be maintained in an optimum state, and an increase in the number of program loops can be suppressed. Thus, an increase in write time can be maintained in a substantially constant state regardless of the number of W/E.

3. Third Embodiment

Next, a memory system according to a third embodiment will be described. The third embodiment is performed by combining the first embodiment and the second embodiment. In the following, description on the same configuration and operation as in the first embodiment and the second embodiment will be omitted, and a configuration and an operation different from the configurations and operations of the first embodiment and the second embodiment will be mainly described.

3.1 Update Process

An update process of an initial write voltage management table in a memory system according to the third embodiment will be described.

Figure 15:
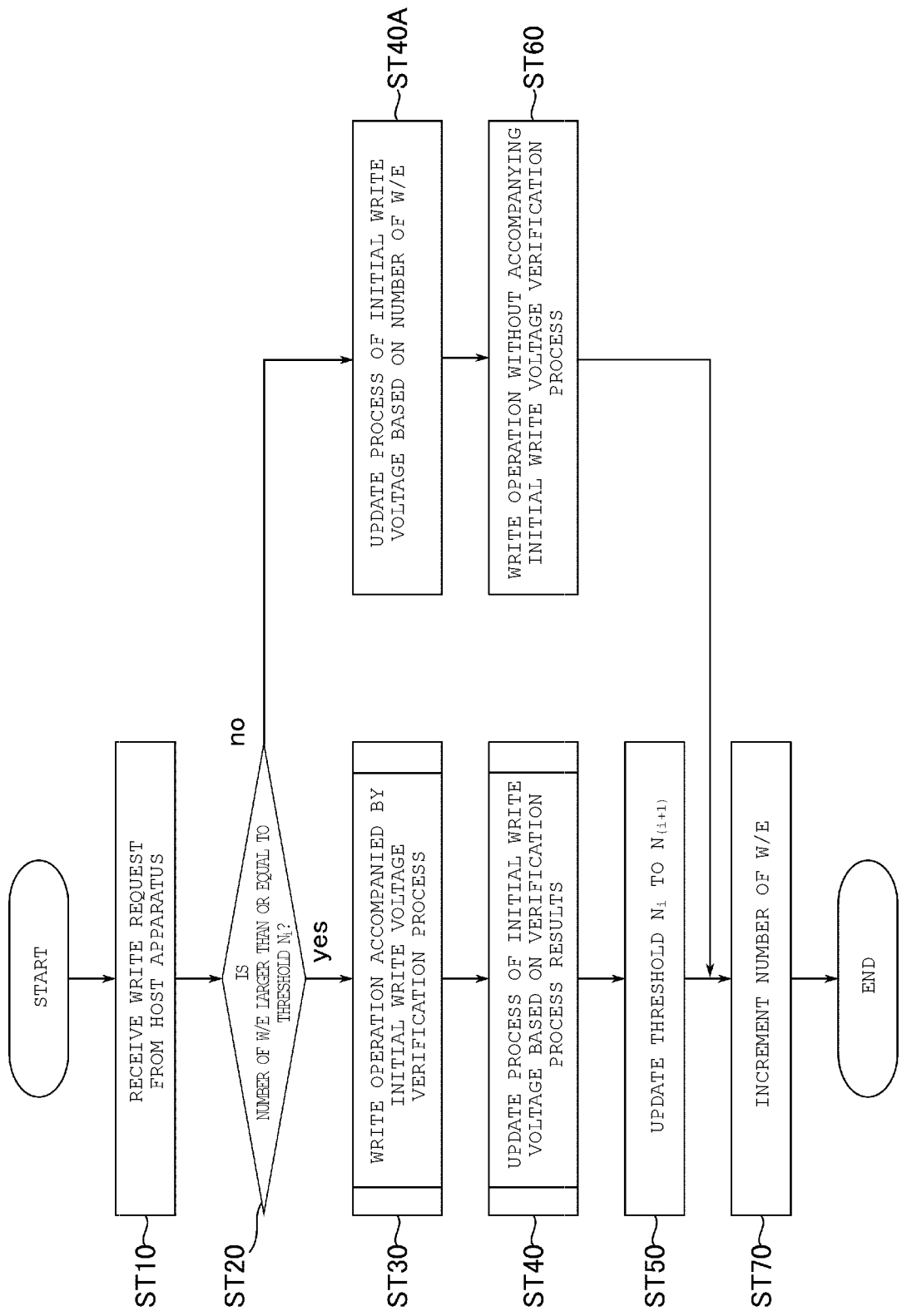
FIG. 15 is a flowchart illustrating an update process of an initial write voltage management table in a memory system according to a third embodiment.

FIG. 15 is a flowchart illustrating the update process of the initial write voltage management table in the memory system according to the third embodiment. FIG. 15 corresponds to FIG. 9 in the first embodiment and FIG. 13 in the second embodiment.

As illustrated in FIG. 15, in step ST10, the memory controller 30 receives a write request from the host apparatus 2 during the actual operation phase.

In step ST20, the memory controller 30 determines whether or not the number of W/E corresponding to a group of the plurality of memory cell transistors MT that are write targets is greater than or equal to a predetermined threshold $N_i$ with reference to the initial write voltage management table in the memory 32.

When it is determined that the number of W/E is greater than or equal to the threshold $N_i$ (step ST20; yes), the process proceeds to steps ST30 to ST50.

In step ST30, the memory controller 30 and the semiconductor storage device 10 perform the write operation including the verification process of the initial write voltage, and the process proceeds to step ST40.

In step ST40, the memory controller 30 and the semiconductor storage device 10 perform the update process of the initial write voltage management table based on the verification process results, and the process proceeds to step ST50.

In step ST50, the memory controller 30 updates the threshold from $N_i$ to $N_{(i+1)}$ ($>N_i$), which is used for determining whether to execute the update process for a subsequent new write request from the host apparatus 2, and the process proceeds to step ST70.

Meanwhile, when it is determined in step ST20 that the number of W/E is smaller than the threshold $N_i$ (step ST20; no), the process proceeds to step ST40A.

In step ST40A, the memory controller 30 performs the update process of the initial write voltage management table based on the number of W/E before the write operation is performed, and the process proceeds to step ST60.

In step ST60, the memory controller 30 and the semiconductor storage device 10 perform the write operation without the update process of the initial write voltage, and the process proceeds to step ST70. In this case, the write operation is performed with reference to the initial write voltage management table updated in step ST40A.

In step ST70, the memory controller 30 increments the number of W/E associated with a group (e.g., the word line WL, the string unit SU, and the like) corresponding to the write target with reference to the initial write voltage management table.

By operating as described above, the CPU 31 calculates the initial write voltage IVPGM according to the number of W/E until the number of W/E reaches a certain number, and can cause the semiconductor storage device 10 to execute the write operation including the verification process of the initial write voltage IVPGM each time the number of W/E reaches a certain number.

3.2 Effect of Present Embodiment

According to the third embodiment, the memory controller 30 updates the initial write voltage IVPGM without performing the write operation accompanied by the verification process of the initial write voltage until the number of W/E reaches the threshold $N_i$. Thereby, during a period until the number of W/E reaches the threshold $N_i$, it is possible to apply an optimum initial write voltage predicted by the CPU 31.

If the number of W/E reaches the threshold $N_i$, the memory controller 30 performs the write operation accompanied by the verification process of the initial write voltage to obtain an actual measurement value of the optimum initial write voltage IVPGM. Thereby, it is possible to eliminate a deviation between the predicted value and the actual measurement value of the optimum initial write voltage IVPGM each time the number of W/E reaches the threshold $N_i$. Thus, a margin of the initial write voltage IVPGM with respect to the write voltage that causes excessive write can be constantly maintained in an optimum state.

4. Modification Example and the Like

As described above, while various embodiments have been described, the first embodiment, the second embodiment, and the third embodiment are non-limiting, and various modifications may be made appropriately.

4.1 First Modification Example

The first embodiment, the second embodiment, and the third embodiment as illustrated in FIG. 5 are not limited a case where the initial write voltage IVPGM is managed for each cell unit CU in the memory 32. For example, by grouping the plurality of cell units CU, the plurality of string units SU, the plurality of word lines WL, the plurality of blocks BLK, or the plurality of Chips, the same initial write voltage IVPGM may be applied to the same group. That is, the same group may be a write unit to the memory cell array 17, an erasure unit, or a word line WL unit, or may optionally include the plurality of units.

FIG. 16 is a conceptual diagram illustrating an initial write voltage management table of a memory system according to a first modification example. In the example of FIG. 16, one initial write voltage IVPGM is assigned to the plurality of memory cell transistors MT (regardless of the string unit SU) connected to the same word line WL. Thereby, it is possible to reduce a size of the initial write voltage management table, and to reduce a load on the memory controller 30. In addition, by grouping the plurality of memory cell transistors MT in which increase characteristics of a threshold voltage with respect to the number of W/E have the same tendency, the table size can be reduced without decreasing an accuracy of optimization of the initial write voltage IVPGM.

FIG. 16 shows an example in which the grouping is performed in the block BLK0 of the Chip0, but the memory cell transistors MT in a plurality of different blocks BLK may be grouped into one group. For example, the plurality of memory cell transistors MT connected to the word line WL0 may be grouped into one group regardless of the block BLK or the Chip to which the transistors belong.

In the first modification example, the number of W/E may be managed in units smaller than the unit in which the initial write voltage IVPGM is grouped. In this case, for example, a maximum value or an average value of the number of W/E in the group may be applied as the number of W/E used for the update process.

When a write method is used in which data is written by a plurality of program loops, the memory controller 30 may store a set of the initial write voltages IVPGM and the number of W/E corresponding to each of the plurality of program loops in the same group of the initial write voltage management table.

In a first example of a method in which data is written by a plurality of program loops, data corresponding to a part of all pages is written by a first program loop (e.g., two pages out of four pages in the QLC write method) and data corresponding to the remaining pages is written by a second program loop. In the first example, data may be written in two stages to the memory cell transistor MT.

In addition, in a second example of the method in which data is written by a plurality of program loops, a threshold voltage of the memory cell transistor MT including a write target and a periphery thereof may be increased by the first program loop to a certain extent, and a threshold voltage distribution is finely adjusted by the second program loop. According to the second example, an influence of change in the threshold voltage of the memory cell transistor MT which is a write target can be reduced by the write operation to the surrounding memory cell transistor MT.

FIG. 17 is a conceptual diagram illustrating an initial write voltage management table of a memory system according to another modification example of the first modification example. In the example of FIG. 17, two sets of the initial write voltages IVPGM and the number of W/E are assigned to the same group. Thereby, in a write method in which a program loop is performed a plurality of times (e.g., twice in the example of FIG. 17) in the write operation as described above, a set of the initial write voltages IVPGM and the number of W/E is independently managed in each program loop.

4.2 Second Modification Example

In the first embodiment, the second embodiment, and the third embodiment are not limited to a case where the write operation accompanied by the verification process of the initial write voltage is performed for each unit grouped in the initial write voltage management table. For example, results of the update process performed for one group in the initial write voltage management table may be reflected in another group.

FIG. 18 is a conceptual diagram illustrating an update process of an initial write voltage management table in a memory system according to a second modification example. FIG. 18 schematically illustrates a state in which the update process of the initial write voltage IVPGM performed for one entry of the initial write voltage management table is reflected in the other entry.

The example of FIG. 18 illustrates a case where the initial write voltage IVPGM is stored in the initial write voltage management table for each set (i.e., for each cell unit CU) of the word line WL and the string unit SU. Specifically, for example, the initial write voltage IVPGM=VPGM0+13ΔVPGM are associated with the plurality of memory cell transistors MT (i.e., WL0/SU0) connected to the word line WL0 and belonging to the string unit SU0. In addition, the initial write voltages IVPGM=VPGM0+12ΔVPGM and VPGM0+12ΔVPGM are associated with the plurality of memory cell transistors MT (i.e., WL0/SU1 to WL0/SU3) belonging to the string units SU1 to SU3 connected to the word line WL1. The initial write voltage IVPGM=VPGM0+14ΔVPGM is associated with the plurality of memory cell transistors MT (i.e., WL1/SU0) connected to the word line WL1 and belonging to the string unit SU1.

Here, the memory controller 30 performs the update process for the WL1/SU0 in the above-described initial write voltage management table. Thereby, it is assumed that the initial write voltage IVPGM=VPGM0+12ΔVPGM is associated with WL1/SU0. In this case, the initial write voltage IVPGM associated with WL1/SU0 changes by −2ΔVPGM.

In the second modification example, results of the update process for WL1/SU0 (i.e., subtraction of 2ΔVPGM) is also reflected in the other groups. Thereby, if the update process is performed for one group, the initial write voltage IVPGM can be managed at an appropriate value without performing the update process for another group. Accordingly, for example, it is possible to prevent an increase in the number of performances of the write operation accompanied by the verification process, and consequently, it is possible to prevent an increase in write operation time.

The example of FIG. 18 illustrates a non-limiting case where the results of the update process for one group is uniformly reflected in all groups. For example, a plurality of groups that can reflect the results of the update process in a certain group may be previously set. Thereby, the results of the update process can be appropriately reflected in a group of the groups having the same threshold voltage increase characteristics.

4.3 Third Modification Example

For example, the initial write voltage IVPGM may be updated by using parameters other than the number of W/E.

Figure 19:
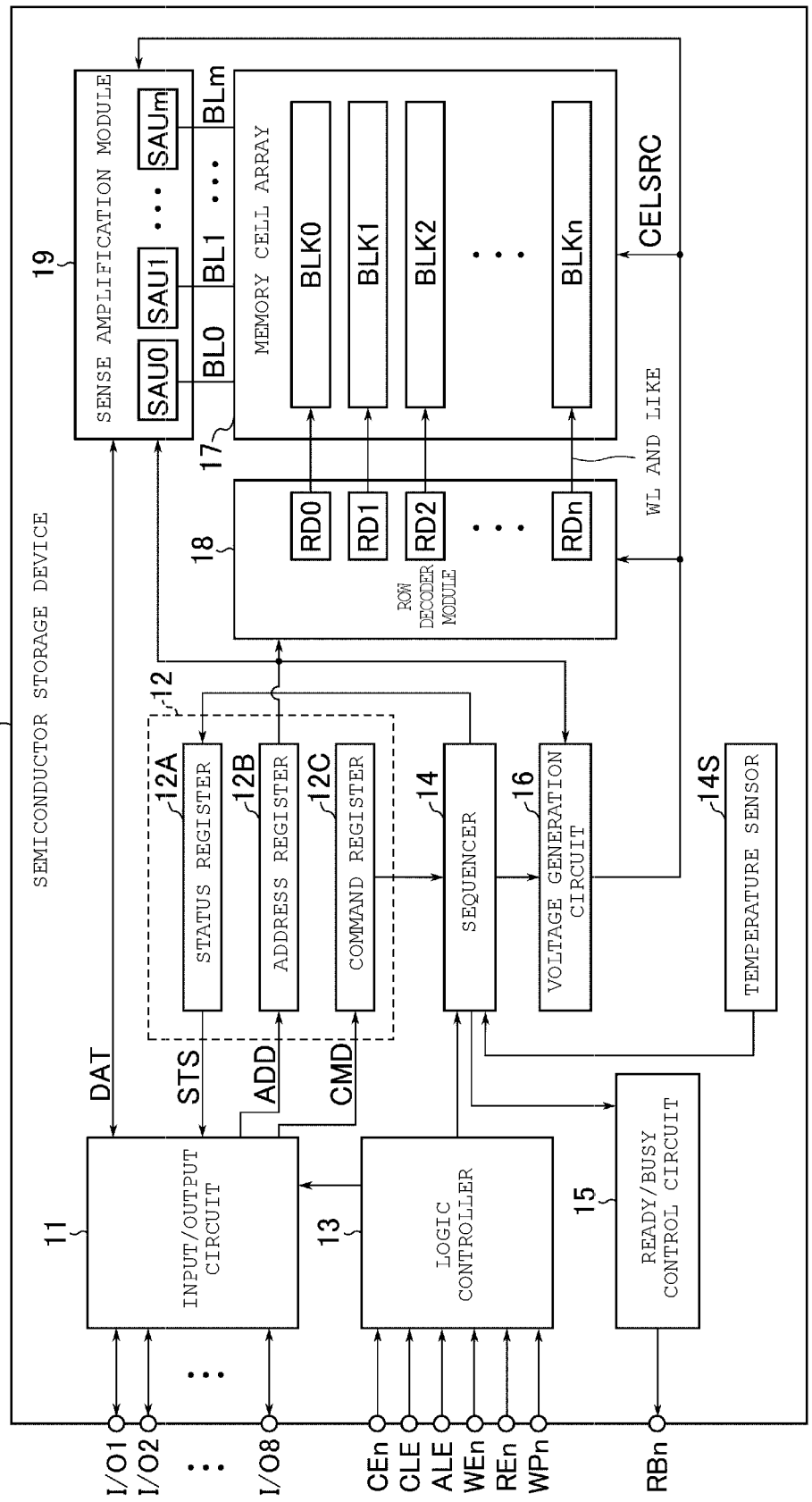
FIG. 19 is a block diagram illustrating a configuration of a semiconductor storage device according to a third modification example.

FIG. 19 is a block diagram illustrating a configuration of a semiconductor storage device in a memory system according to a third modification example. As illustrated in FIG. 19, the semiconductor storage device 10 may further include a temperature sensor 14S.

For example, the temperature sensor 14S measures an internal temperature of the semiconductor storage device 10 (e.g., the memory cell array 17). If acquiring temperature measurement results of the temperature sensor 14S, the sequencer 14 transmits the measurement results to the memory controller 30.

By configuring as described above, the memory controller 30 can correct the initial write voltage IVPGM based on an internal temperature state of the semiconductor storage device 10.

FIG. 20 is a conceptual diagram illustrating an initial write voltage correction table in the memory system according to the third modification example. The initial write voltage correction table is previously stored in, for example, the memory 32 of the memory controller 30.

As illustrated in FIG. 20, a correction amount of the initial write voltage IVPGM is set in the initial write voltage correction table, based on the number of W/E and temperature information from the temperature sensor 14S. For example, when the number of W/E is in a range from $N_0$ to $N_1$, the initial write voltage IVPGM is set in the example of FIG. 20 according to a case where a temperature of the semiconductor storage device 10 is in a low temperature state or a case where a temperature of the semiconductor storage device 10 is in a high temperature state. In addition, for example, when the number of W/E is in a range (e.g., a range from $N_1$ to $N_2$) different from the range from $N_0$ to $N_1$, another initial write voltage IVPGM is set according to a case where the temperature of the semiconductor storage device 10 is in the low temperature state or a case where the temperature of the semiconductor storage device 10 is in the high temperature state. Here, the low temperature state and the high temperature state mean a significantly lower state and a significantly higher state, respectively, as compared with a case where the temperature of the semiconductor storage device 10 is a normal temperature (e.g., room temperature).

By configuring as described above, when performing the write operation, the memory controller 30 can acquire the correction amount of the initial write voltage IVPGM with reference to the initial write voltage correction table by previously acquiring the temperature information of the semiconductor storage device 10. Thereby, even when a temperature dependency of an optimum initial write voltage changes depending on the number of W/E, the initial write voltage IVPGM can be appropriately corrected based on the initial write voltage correction table.

4.4 Other

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor storage device including
a memory cell array including a plurality of groups of memory cells, and
a control circuit configured to perform, upon receipt of a write command, a write operation on one of the groups of memory cells; and
a memory controller is configured to
when transmitting the write command to perform the write operation on the one of the groups of memory cells, determine a first write voltage value for the write operation, and transmit the write command to the semiconductor storage device together with the determined first write voltage value, and
update the first write voltage value for the write operation each time a total number of write operations or erase operations that have been performed on said one of the groups of memory cells reaches one of a plurality of thresholds.

2. The memory system according to claim 1, wherein
upon receipt of the write command, the control circuit performs a first program loop for writing data into the one of the groups of memory cells using the first write voltage value.

3. The memory system according to claim 1, wherein
the memory controller is further configured to
determine whether the total number of write operations or erase operations has reached a threshold, and
upon determining that the total number has reached the threshold, transmit a first command to the semiconductor storage device, and
upon receipt of the first command, the control circuit determines a second write voltage value that causes threshold voltages of a predetermined number of memory cells among the one of the groups of memory cells to be greater than a predetermined voltage.

4. The memory system according to claim 3, wherein
upon receipt of the first command, the control circuit determines an initial write voltage value that is less than the first write voltage value for performing the write operation.

5. The memory system according to claim 3, wherein
upon receipt of the first command, the control circuit outputs the second write voltage value to the memory controller.

6. The memory system according to claim 3, wherein
after completion of the write operation, the memory controller transmits a second command to the semiconductor storage device, and
upon receipt of the second command, the control circuit outputs the second write voltage value to the memory controller.

7. The memory system according to claim 6, wherein
the memory controller comprises a memory that stores the first write voltage value, and
the memory controller is further configured to update the first write voltage value stored in the memory with the second write voltage value.

8. The memory system according to claim 7, wherein
when further writing data onto the one of the groups of memory cells, the memory controller transmits a write command to the semiconductor storage device together with the updated first write voltage value.

9. The memory system according to claim 7, wherein
the memory controller is further configured to store a third write voltage value for a write operation on another group of memory cells in the memory, and update the third write voltage value based on a difference between the first and second write voltage values.

10. The memory system according to claim 1, wherein
the memory controller comprises a memory that stores the first write voltage value, and
the first write voltage value is updated with a second write voltage value that is less than the first write voltage value.

11. The memory system according to claim 1, wherein
each group of memory cells includes a plurality of memory cells as a write unit or an erasure unit of the memory cell array or a plurality of memory cells connected to a single word line.

12. The memory system according to claim 1, wherein
the semiconductor storage device further comprises a temperature sensor configured to output a temperature, and
the memory controller determines the first write voltage value further based on the temperature that is output by the temperature sensor.

13. The memory system according to claim 1, wherein
the memory controller further comprises a register that stores the first write voltage value.

14. A method for writing data into a semiconductor storage device including a plurality of groups of memory cells, the method comprising:
determining a first write voltage value for the semiconductor storage device to perform a write operation on one of the groups of memory cells;
transmitting a write command that causes a semiconductor storage device to perform the write operation on the one of the groups of memory cells, together with the determined first write voltage value; and
updating the first write voltage value for the write operation each time a total number of write operations or erase operations that have been performed on said one of the groups of memory cells reaches one of a plurality of thresholds.

15. The method according to claim 14, further comprising:
upon receipt of the write command, performing a first program loop for writing data into the one of the groups of memory cells using the first write voltage value.

16. The method according to claim 14, further comprising:
determining whether the total number of write operations or erase operations has reached a threshold; and
upon determining that the total number has reached the threshold, transmitting a first command to the semiconductor storage device, wherein
the semiconductor storage device, upon receipt of the first command, determines a second write voltage value that causes threshold voltages of a predetermined number of memory cells among the one of the groups of memory cells to be greater than a predetermined voltage.

17. The method according to claim 16, wherein the semiconductor storage device, upon receipt of the first command, determines an initial write voltage value that is less than the first write voltage value for performing the write operation.

18. The method according to claim 16, further comprising:
receiving the second write voltage value that is output from the semiconductor storage device.

19. The method according to claim 16, further comprising:
after completion of the write operation, transmitting a second command to the semiconductor storage device; and
receiving the second write voltage value that is output from the semiconductor storage device in response to the second command.

20. The method according to claim 18, further comprising:
replacing the first write voltage value stored in a memory with the second write voltage value.

\* \* \* \* \*